(12) United States Patent
Nickel

(10) Patent No.: US 12,271,660 B2
(45) Date of Patent: *Apr. 8, 2025

(54) SYSTEMS AND METHODS FOR UTILIZING INFORMATION OF A 3D MODELING APPLICATION TO FACILITATE OPERATION OF FABRICATION MACHINES

(71) Applicant: Allied BIM Inc., Bozeman, MT (US)

(72) Inventor: Brian D. Nickel, Meridian, ID (US)

(73) Assignee: ALLIED BIM INC., Bozeman, MT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/416,406

(22) Filed: Jan. 18, 2024

(65) Prior Publication Data

US 2024/0273247 A1 Aug. 15, 2024

Related U.S. Application Data

(63) Continuation of application No. 18/319,474, filed on May 17, 2023, now Pat. No. 11,907,618.

(60) Provisional application No. 63/345,671, filed on May 25, 2022, provisional application No. 63/343,079, filed on May 17, 2022.

(51) Int. Cl.
*G06F 30/12* (2020.01)

(52) U.S. Cl.
CPC .................... *G06F 30/12* (2020.01)

(58) Field of Classification Search
CPC ........................................ G06F 30/12
See application file for complete search history.

(56) References Cited

U.S. PATENT DOCUMENTS

| | | |
|---|---|---|
| 8,886,348 B2 | 11/2014 | Bollendorf |
| 2005/0137740 A1 | 6/2005 | Lindstrom et al. |
| 2013/0310950 A1 | 11/2013 | Chiang et al. |
| 2014/0046476 A1 | 2/2014 | Walker et al. |
| 2015/0091208 A1 | 4/2015 | Sadusk et al. |

(Continued)

OTHER PUBLICATIONS

Peek NN. Making machines that make: object-oriented hardware meets object-oriented software (Doctoral dissertation, Massachusetts Institute of Technology). (Year: 2016).*

(Continued)

*Primary Examiner* — Chuen-Meei Gan
(74) *Attorney, Agent, or Firm* — William M. Fischer

(57) ABSTRACT

A method facilitating operation of a fabrication machine (FM) includes receiving, by a fabrication center application (FCA) running on a computing device (CD), via a fabrication center connector websocket (FCCW), and from a fabrication tools application associated with a 3D modeling application running on another CD, 3D model data of a to-be-fabricated part or assembly (TBF-P/A). The method includes generating, by the FCA, and based on the 3D model data, data representative of an enhanced cut (or bend or threading) list (E-C/B/T-L) usable by a machine control application (MCA) running on a third CD for the FM to fabricate the TBF-P/A, the third CD also running a fabrication desktop application associated with the MCA. The method includes transmitting, by the FCA, and via the FCCW, the E-C/B/T-L data to the third CD to enable use by the MCA of the E-C/B/T-L data for fabricating the TBF-P/A by the FM.

20 Claims, 25 Drawing Sheets

(56) References Cited

U.S. PATENT DOCUMENTS

| | | |
|---|---|---|
| 2015/0205544 A1 | 7/2015 | Webb et al. |
| 2017/0093700 A1* | 3/2017 | Gilley .................... H04L 45/44 |
| 2018/0069981 A1* | 3/2018 | Pekarske ........... H04N 1/00015 |
| 2018/0085877 A1 | 3/2018 | Agudelo |
| 2021/0287451 A1 | 9/2021 | Baudisch |
| 2021/0311451 A1 | 10/2021 | Shapiro et al. |

OTHER PUBLICATIONS

Step Tools Inc Troy NY Troy United States, 2019. Mind the Gap: Filling the Gap Between CAD and the CNC Using Engineering Services. (Year: 2019).*

International Search Report and Written Opinion for PCT Application No. PCT/US2023/31472, mailed Jan. 5, 2024; 16 pages.

International Application No. PCT/US2023/022615, International Search Report, Written Opinion, 13 pages, Aug. 22, 2023.

International Application No. PCT/US2023/031472, Invitation To Pay Additional Fees, 3 pages, Oct. 31, 2023.

Takahashi, Haruki et al., "3D Pen + 3D Printer: Exploring The Role Of Humans And Fabrication Machines In Creative Making," CHI Conference on Human Factors in Computing Systems Proceedings, 12 pages, May 4-9, 2019.

Peek NN. Making machines that make: object-oriented hardware meets object-oriented software (Doctoral dissertaion, Massachusetts Institute of Technology). (Year: 2016).

* cited by examiner

SYSTEMS AND METHODS FOR UTILIZING INFORMATION OF A 3D MODELING APPLICATION TO FACILITATE OPERATION OF FABRICATION MACHINES

CROSS-REFERENCE TO RELATED APPLICATIONS

This application is a continuation of U.S. patent application Ser. No. 18/319,474 filed May 17, 2023 and issued as U.S. Pat. No. 11,907,618 on Feb. 20, 2024; which claims the benefit of and priority to U.S. Provisional Patent Application No. 63/343,079 filed May 17, 2022 and U.S. Provisional Patent Application No. 63/345,671 filed May 25, 2022, each of which is incorporated by reference herein in its entirety.

BACKGROUND

Three-dimensional (3D) modeling software has become ubiquitous for design of various construction projects including built structures ranging from office buildings to homes. Such 3D modeling software may enable creation of models of to be built structures including mechanical, electrical and plumbing (MEP) aspects with a level of detail corresponding to the actual built structure. In the past, designers may have prepared drawings by hand and those drawings needed to be reproduced and sent to downstream personnel to fabricate parts of the facility to be ultimately built.

At least some known 3D modeling software (e.g., AutoCAD®, Revit®, among others) provides functionality for assigning actual part types and part numbers to pieces and assemblies in the scale models created in the software. A building information model (BIM) may be created for all assemblies, or for a particular assembly, in at least some known 3D modeling software packages. This can be communicated to the fabricators electronically in the form of, for instance, cut (or bend or threading) lists that can be loaded onto local computers associated with individual machines on the floor of fabrication shops. In one known example, cut (or bend or threading) lists generated by 3D modeling software are placed on portable disk drives and then loaded onto the computers of individual fabrication machines like cutting, threading or bending machines. In some cases, operators must manually manipulate the data of cut (or bend or threading) lists to suit the particular machine to be used, which may vary from shop to shop, and also within the same shop.

Having to manually transfer cut (or bend or threading) list data and in some cases change the content of such data files to be functional for particular machines introduces both complexity and lowered unit operation efficiencies, and can often introduce human error leading to wasted material and inaccurately fabricated parts or assemblies being shipped to build sites.

Accordingly, a need exists for technology that overcomes the problems demonstrated above, as well as one that provides additional benefits. The examples provided herein of some prior or related devices, systems and methods, and their associated limitations, are intended to be illustrative and not exclusive. Other limitations of existing or prior systems will become apparent to those of skill in the art upon reading the following detailed description.

SUMMARY

This disclosure provides systems, methods and software program products for utilizing information of a 3D modeling software package (e.g., AUTOCAD, Revit®, among others) to facilitate operation of fabrication machines. Embodiments of the system according to the present technology may include a Fabrication Tools block providing an automated tool for creating fabrication drawings. The Fabrication Tools block may enable users to assemble models, spool assemblies, and fabricate assemblies or parts thereof on network connected fabrication machines. The tools and techniques according to the present technology may increase traditional spooling workflows up to 800% or more quickly as compared to known systems, methods and software.

Embodiments of the system according to the present technology may also include a Fabrication Center block. The Fabrication Center block may enable cloud integration with a construction management software, such as BIM 360®. The Fabrication Center block may enable users to publish, track, and communicate with all project stakeholders in the Fabrication Center. Additionally, the Fabrication Center block according to the present technology may enable users and stakeholders to manage fabrication of assemblies. Additionally, users of the Fabrication Center block may create packages, place orders, and connect designers directly to managers and other personnel of fabrication shops.

Embodiments of the system according to the present technology may further include a Fabrication Desktop block. The Fabrication Desktop block may utilize a web socket to connect fabrication shops, machines therein, and staff directly to the Fabrication Center block. The Fabrication Desktop block may enable synchronization of cut (or bend or threading) lists and assignment of fabrication work orders to workstations to streamline and digitally connect an efficient design-to-fabrication process across business units. The Fabrication Desktop block of the present technology may further provide streamlined communication by assigning work to users while enabling complete insight into the overall process and production.

A first aspect of the disclosure provides a method executed on at least one computing device to facilitate operation of one or more fabrication machines using digitally stored part or assembly information of a three-dimensional (3D) modeling application. The method may include the step of establishing, by a fabrication tools application associated with the 3D modeling application running on a first computing device, and via a fabrication center connector websocket, data communication with a fabrication center application running on a second computing device. The method may include the step of receiving, by the fabrication center application and from the fabrication tools application, and via the fabrication center connector websocket, data representative of a 3D model of a to-be-fabricated part or assembly modeled in the 3D modeling application. The method may include the step of generating, by the fabrication center application, and based at least in part on the data representative of the 3D model of the to-be-fabricated part or assembly, data representative of at least one enhanced cut (or bend or threading) list usable by a machine control application for the one or more fabrication machines to fabricate the to-be-fabricated part or assembly. The method may include the step of establishing, by the fabrication center application, and via the fabrication center connector websocket, data communication with a fabrication desktop application associated with the machine control application running on at least a third computing device and configured to control operation of the one or more fabrication machines. The method may include the step of transmitting, by the fabrication center application, and via the fabrication center connector websocket, the data representative of the at least one enhanced cut (or bend or threading) list to the at least a third computing device to enable use by the machine control application of the at least one enhanced cut (or bend or threading) list for fabrication of the to-be-fabricated part or assembly by the one or more fabrication machines.

A second aspect of the disclosure provides a system for facilitating operation of one or more fabrication machines using digitally stored part or assembly information of a three-dimensional (3D) modeling application. The system may include a computing device (e.g., a server). The server may include at least one processor operably coupled to: a communications interface, and a memory storage device storing a fabrication center application. The at least one processor may be configured to direct a communications interface of a first computing device running a fabrication tools application associated with the 3D modeling application to establish, via a fabrication center connector websocket of the system, data communication with a fabrication center application running on the server computing device. The at least one processor may be configured to direct a communications interface of the server computing device to receive, via the fabrication center connector websocket, data representative of a 3D model of a to-be-fabricated part or assembly modeled in the 3D modeling application from the first computing device running the fabrication tools application. The at least one processor may be configured to generate, using the fabrication center application, and based at least in part on the data representative of the 3D model of the to-be-fabricated part or assembly, data representative of at least one enhanced cut (or bend or threading) list usable by a machine control application for the one or more fabrication machines to fabricate the to-be-fabricated part or assembly. The at least one processor may be configured to direct a communications interface of at least a third computing device, and under control of a fabrication desktop application associated with the machine control application running on the at least a third computing device and configured to control operation of the one or more fabrication machines, to establish, via the fabrication center connector websocket, data communication with the fabrication desktop application. The at least one processor may be configured to direct the communications interface of the server computing device to transmit, via the fabrication center connector websocket, the data representative of the at least one enhanced cut (or bend or threading) list to the at least a third computing device to enable use by the machine control application of the at least one enhanced cut (or bend or threading) list for fabrication of the to-be-fabricated part or assembly using the one or more fabrication machines.

A third aspect of the disclosure provides one or more non-transitory computer readable media. In some examples according to the third aspect of the disclosure, the one or more non-transitory computer readable media may be embodied in, or may include, a computer program (or software and/or firmware) product. The one or more non-transitory computer readable media may have stored thereon program instructions which, when executed by one or more processors of a system (e.g., of the second aspect summarized above) to facilitate operation of one or more fabrication machines using digitally stored part or assembly information of a three-dimensional (3D) modeling application, cause the system to direct a communications interface of a first computing device, and under control of a fabrication tools application associated with the 3D modeling application running on the first computing device, to establish, via a fabrication center connector websocket, data communication with a fabrication center application running on a second computing device. When executed by one or more processors of the system, the program instructions may cause the system to direct a communications interface of the second computing device, and under control of the fabrication center application, to receive, via the fabrication center connector websocket, data representative of a 3D model of a to-be-fabricated part or assembly modeled in the 3D modeling application from the first computing device running the fabrication tools application. When executed by one or more processors of the system, the program instructions may cause the system to generate, using the fabrication center application, and based at least in part on the data representative of the 3D model of the to-be-fabricated part or assembly, data representative of at least one enhanced cut (or bend or threading) list usable by a machine control application for the one or more fabrication machines to fabricate the to-be-fabricated part or assembly. When executed by one or more processors of the system, the program instructions may cause the system to direct a communications interface of at least a third computing device, and under control of a fabrication desktop application associated with the machine control application running on the at least a third computing device and configured to control operation of the one or more fabrication machines, to establish, via the fabrication center connector websocket, data communication with the fabrication desktop application. When executed by one or more processors of the system, the program instructions may cause the system to direct the communications interface of the second computing device to transmit, via the fabrication center connector websocket, the data representative of the at least one enhanced cut (or bend or threading) list to the at least a third computing device to enable use by the machine control application of the at least one enhanced cut (or bend or threading) list for fabrication of the to-be-fabricated part or assembly using the one or more fabrication machines.

BRIEF DESCRIPTION OF THE DRAWINGS

One or more embodiments of the present invention are illustrated by way of example and not limitation in the figures of the accompanying drawings, in which like references indicate similar elements.

DETAILED DESCRIPTION

Figure 1:
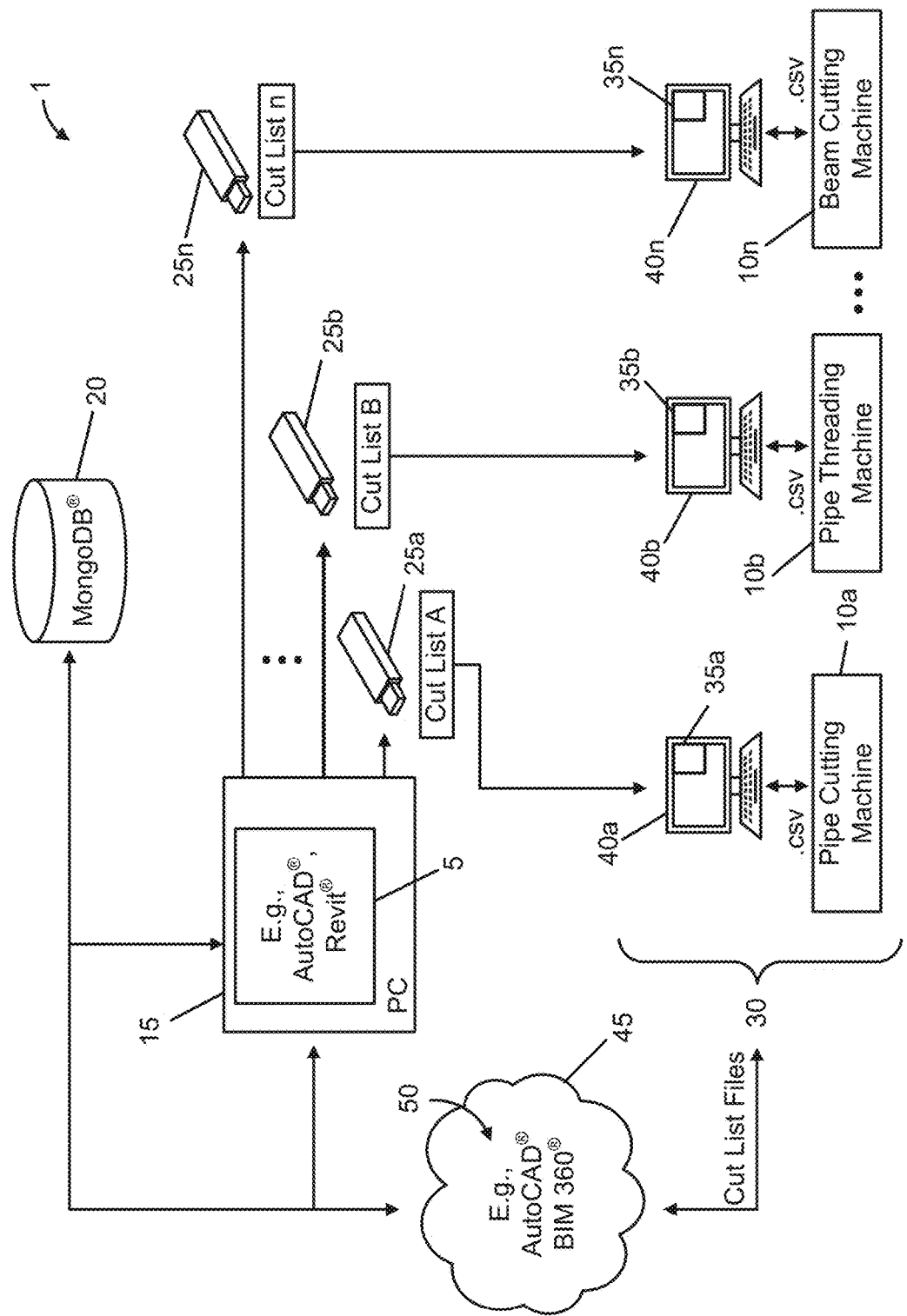
FIG. 1 is a diagram of a system for utilizing information of a 3D modeling software package to facilitate operation of fabrication machines, according to a known embodiment.

The following description and the appended drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but no other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

As will become apparent to persons skilled in the art, the disclosed embodiments are not merely process steps capable of being performed using generic computing devices, but which could entirely be performed mentally or otherwise by a human being, including with the aid of pen and paper. Rather, the unique algorithms described herein according to the present technology are required to be encoded in software (or firmware) instructions to direct (e.g., "cause") the physical actions of the various computing, communications and data storage devices in a manner believed to be as yet unknown in the pertinent technological field. These physical effects and actions include, without limitation, transmission of encoded data as signals over wired or wireless communication channels, both within one particular computing device and over great distances over spans of the Earth or outer space. The described algorithms direct data to be stored according to received data inputs of the data owners via graphical user interfaces that are transmitted to, or otherwise caused to be displayed on, user devices like personal computers and smartphones in communication with remote servers, via the Internet, for example. All of these actions, and numerous others that are described herein, are performed by physical computing and communication devices, as directed by the disclosed algorithms. Furthermore, the physical actions which are specifically caused to occur using computing devices having processors taking as commands encoded software or firmware instructions stored in non-transient computer-readable storage media are performed and coordinated thereby in substantially real-time. Real-time is defined as a very nearly instantaneous result of an input, stimulus, or computation performed by a computing device as described herein, where the timing of a subsequent action is limited only by the physical makeup or design of the computing device and communications network. For example, a duration between a time upon which a result of a first computation is generated by a first networked computing device and a time that result becomes available for a subsequent computation by a second networked computing device may be limited only by a transmission time required by the physical medium of the wired, optical or wireless network connecting the first and second computing devices. A person having ordinary skill in the art will recognize and appreciate that not only are the disclosed algorithms incapable of being performed mentally by a human being, they are certainly not capable of being performed mentally with the aid of pen and paper in real time, or otherwise by a human being within a time sufficient to provide both the disclosed technical advantages and effects, and the improved user experience, in the practical application to the pertinent technological field.

FIG. 1 is a diagram of a system (1) for utilizing information of a 3D modeling software (5) package to facilitate operating fabrication machines (10), according to a known embodiment. A designer workstation computer (15) may have installed thereon 3D modeling software (5) such as AutoCAD® or Revit® (both of AutoDesk®). Assemblies may be identified from a building-wide 3D model for fabrication, with added annotations such as part identifiers and other information. These may be stored in formats such as .rvt files in the case of the Revit® program.

The 3D modeling software (5) may be in communication with a remote database (20) (e.g., MongoDB®). MongoDB® (20) is a source-available cross-platform document-oriented database program, also known as a database-as-a-service. As applied to system (1), and to the methods and software of the present technology as disclosed herein, MongoDB® (20) can, among other things, facilitate various automations performed during the course of designers using 3D modeling software (5) at computer workstations (15). Also, files generated during the course of preparing a 3D model and a BIM model can be very large and thus MongoDB® (20) can be useful to lessen the computation and storage load on computer workstation (15).

Aspects of 3D modeling software (5) may enable generation of "cut (or bend or threading) lists" for downstream use by fabrication machines (10) such as cutting, threading and bending tools. A variety of such tools are expected to be known by those having ordinary skill in the art. In one known example, the cut (or bend or threading) list files (e.g., .csv format) are stored on portable storage media (25) such as USB "thumb" disks (e.g., 25a, 25b, . . . , 25n).

In some cases, the designer operating the 3D modeling software (5) at computer (15) may be co-located with a fabrication shop (30) having the machines (10). In that case, the portable storage media (25) containing the cut (or bend or threading) lists may be hand carried from computer workstation (15) to load onto machine control software (35) found on computer workstations (e.g., 40a, 40b, . . . , 40n) associated with individual fabrication machines (e.g., 10a, 10b, . . . , 10n). In other cases, the designer operating the 3D modeling software (5) at computer (15) may be located far away from the fabrication shop (30) having the machines (10). Thumb drives or other portable storage media (25) having the cut files may thus need to be transported to the fabrication shop (30), such as by mailing, or courier. The cut files may alternatively be emailed or obtained by the fabrication shop using a file transfer protocol over the Internet or other network (45). In the known system (1), designers and/or fabrication shop personnel using the 3D modeling software (5) may need to manually break assemblies apart in the 3D model, and then manually export each one of those, and may additionally need to go through each cut list (or bend or threading) .csv file to tailor it for use by specific machines (10). The generation of individual assemblies for building projects having thousands or even more different assemblies in the 3D model is a cumbersome and time consuming task. Rework of corresponding cut files according to system (1) may add additional burden to these essential tasks. The cut (or bend or threading) list files may be obtained by direct download via a network (45) from a cloud application (50) and/or database (20) by the fabrication shop (30), and then stored on the portable storage media (25) for use with the machines (10). However, that task, along with verifying content and compatibility of the cut (or bend or threading) lists with particular fabrication machines (10), may be both time consuming and subject to human error.

Furthermore, in the known system (1) for utilizing information of a 3D modeling software (5) package to facilitate operating of fabrication machines (10), cut (or bend or threading) list files may not be immediately usable by machine (10) operators in the fabrication shop (30). Each machine (10) includes a dedicated motor controller. Software (e.g., 35a, 35b, . . . , 35n) run at computer workstations (40a, 40b, . . . , 40n) may send commands to respective motor controllers to control motors speeds, rotation directions, and other operational states and parameters for the machines (10a, 10b, . . . , 10n). In some cases, operators in the fabrication shop (30) may need to add information to the cut (or bend or threading) list files generated using the 3D modeling software (5). For instance, the cut files may be missing specifics for the stock raw material, the order that cuts and/or bends are to be made by machines (10), and/or it may contain errors arising from the designer's annotation of the 3D model that require manual correction.

These circumstances may necessitate operators in the fabrication shop (30) to perform manual data entry, corrections and calculations to correct cut files and/or to adapt them for a particular machine (10). For instance, use of the known system (1) with tube or conduit bending machines (10) (e.g., Greenlee®) may require operators to hand key in bend radii, angles, and/or arc lengths. In some cases, known fabrication machines may provide a user the option of transferring a cut or bend list file as, for example a .csv file, using a USB "thumb" drive that may plug in directly to the machine. Yet, such .csv files may need to be prepared manually on one or more computer workstations. In any event, these manual operations can introduce unintended human errors, where such errors may be propagated through the various machine (10) unit operations, potentially resulting is wasted material, poor quality in finished parts and/or assemblies, and/or delay in delivering the product within the expected timeframes.

Some machine (10) control software (35) capable of being run on computer workstations (10) may include features for optimizing cut lengths from a stock length of, for example and without limitation, pipe, strut, lumber, conduit, rebar, and like stock material (e.g., ferrous or non-ferrous, metallic vs. non-metallic). However, known techniques for this may require human modification of machine (10) operational parameters to carry out the instructions based on the cut (or bend or threading) lists. Moreover, known optimization techniques to reduce waste may not account for operator safety considerations.

In any event, the known techniques for delivering cut files to the computer workstations (40) associated with various fabrication machines (10) may be cumbersome and inefficient, as compared to the embodiments of the present technology disclosed herein. As can be appreciated by persons having ordinary skill in the art, the various inefficiencies discussed above of the known system (1) and associated techniques are magnified where the designer (e.g., an engineer or architect employed by a general contractor and using the 3D modeling software (5) at computer (15)) must send cut files for many assemblies to more than one fabrication shop to meet demand and deliver the intended result per the design requirements and specification within a tight timeline.

As will be appreciated, the present technology as disclosed herein enables technical features to enhance efficiency, accuracy, and timeliness of unit operations performed by the known system (1), and provides additional unique features with enabling further such enhancements.

The present technology provides dynamic optimization software for processing materials with an algorithm that automatically nests linear parts along with linear stocks of material. The user can enter any value of stock length and the software will dynamically optimize the material to yield the least amount of waste and material based on the given stock length. Users with BIM models can upload their models to a cloud platform and send lists of linear elements to remote cutting stations via the dedicated and secured applications. This allows users to distribute work remotely to any machine to track cut (and/or bend) status, yield, and general performance of their fabrication shops to gain valuable insights into shop productivity. The disclosed dynamic optimization algorithm places short material pieces to the front of the given stock to account for safety on automatic cutting machines. The cut (or bend or threading) list distribution techniques according to the present technology may enhance capabilities, throughput and safety of existing machines without substantial redesign or retrofitting to distribute, track, procure, and record insights into the productivity and labor of remote fabrication shop locations. The present technology further facilitates distributing fabrication work to off-site locations and enables shareable routines to enable remote operations access to enhanced cut (or bend or threading) lists for procurement and processing of materials. The present technology advantageously enables the BIM models to be connected to any machine, anywhere in the world, via the Internet.

Figure 2:
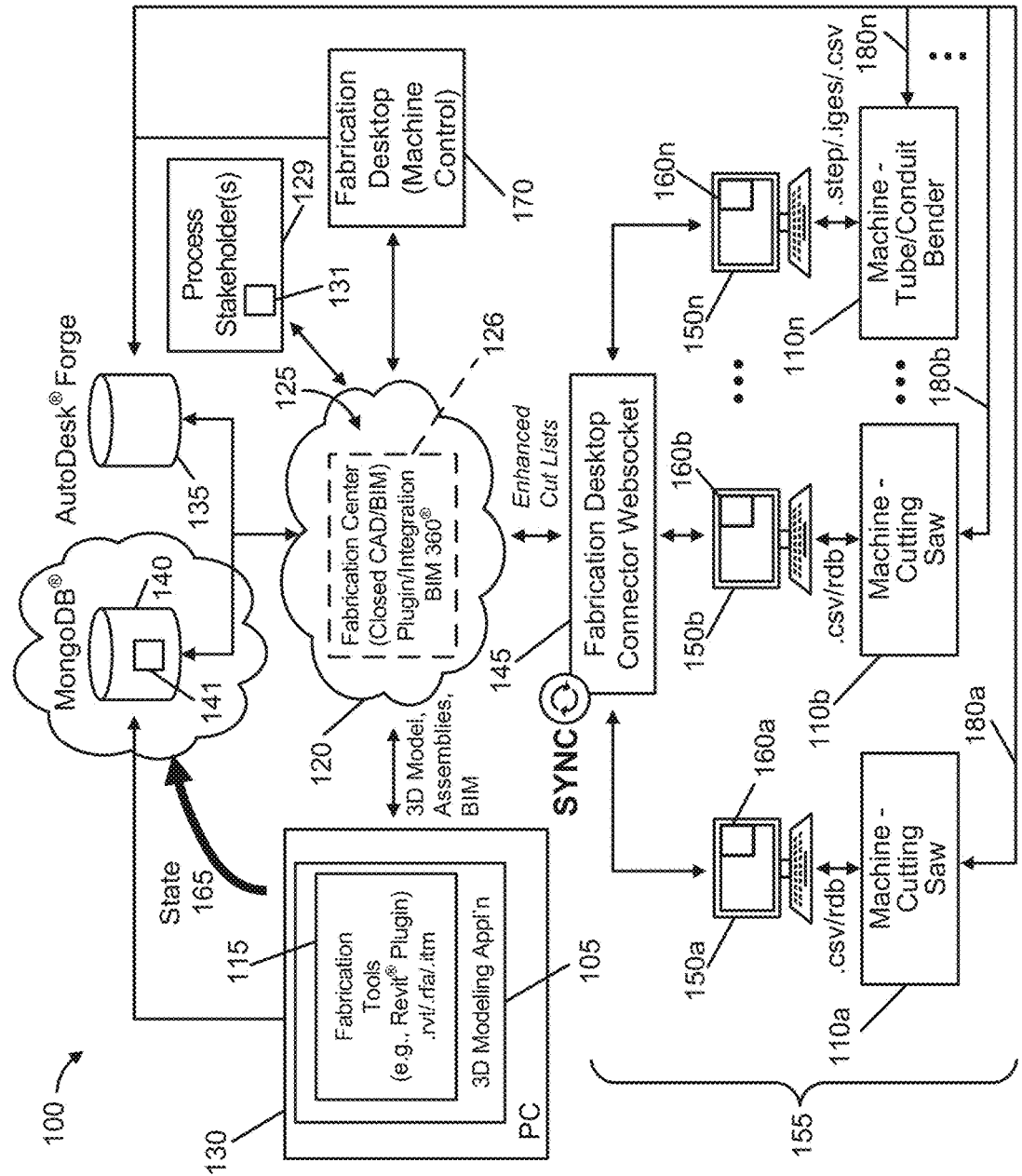
FIG. 2 is a diagram of workflow logic of a system for utilizing information of a 3D modeling software package to facilitate operation of fabrication machines, according to some embodiments of the present technology.

System Architecture:

FIG. 2 is a diagram of workflow logic of a system (100) for utilizing information of a 3D modeling software package (105) to facilitate operation of fabrication machines (e.g., 110*a*, 110*b*, . . . , 110*n*), according to some embodiments of the present technology. The components, or modules, of system (100) include a Fabrication Tools block (115) in communication via a network (120) (e.g., the Internet) with a Fabrication Center block (125). In some embodiments, block (115) is a plugin for a 3D modeling software application (105) (e.g., a Revit® plugin) run on a designer workstation computer (130) (also referring to herein as "first computing device"). Block (125) may be resident on a server or like computing device (126) (also referred to herein as "second computing device") in the cloud and may provide various functionality in system (100) such as a Forge® Plugin (135)/Autodesk® Construction Cloud Integration. System (100) may also include a document or other scalable database (140) connected to the various blocks of system (100) via the network (120). In some embodiments, database (140) may be embodied in, or may include, MongoDB® or other like database (140).

According to https://www.mongodb.com: "MongoDB is a document database used to build highly available and scalable internet applications. MongoDB is a document database with the scalability and flexibility that you want with the querying and indexing that you need. The developer data platform that provides the services and tools necessary to build distributed applications fast, at the performance and scale users demand. MongoDB is a source-available cross-platform document-oriented database program. Classified as a NoSQL database program, MongoDB uses JSON-like documents with optional schemas." A person having ordinary skill in the art is expected to readily recognize and appreciate that specific embodiments of database (140) other than MongoDB® that are now known, as even as yet unknown, may be readily practiced for purposes of accomplishing the advantageous and beneficial technical effects and useful ends according to the present technology.

Block (115) may be connected by way of network (120) with a Fabrication Desktop Connector Websocket block (145) via the cloud-based block (125). Block (145) may be installed on, or otherwise associated with, workstation computers (e.g., 150*a*, 150*b*, . . . , 150*n*). In some embodiments, each of the computers (150*a*, 150*b*, . . . , 150*n*) situated in one or more fabrication shops (155) may be capable of running a local Fabrication Desktop client application block (e.g., 160*a*, 160*b*, . . . , 160*n*). Workstation computer(s) (150) may also be referred to herein as "at least a third computing device." For example, each instance of application block (160) may be in communication with block (125) by way of block (145). In other examples, each instance of application block (160) may connect to block (125) via a dedicated instance of block (145).

Regarding the websocket (145), in some embodiments, it may utilize the "WebSocket" (WS) or "WebSocket Secure" (WSS) computer communications protocol, either of which provides full-duplex communication channels. In an example, that full-duplex communication may be achieved over just a single TCP connection. In either WS, or WSS, the communication between any combination of the first, second, and the at least a third computing devices. WS or WSS protocol may be used in the same scenario of client-server communication. Whereas HTTP may be a stateless protocol, WS or WSS may be stateful protocols, which means the connection between client (e.g., the first (130), or the at least a third (150), computing devices) and server (e.g., second computing device (126)) will keep alive until it is terminated by either party (client or server). After closing the connection by either of the client and server, the connection is terminated from both ends. An application may be downloaded and installed on a computing device involved in practicing the present technology to thereby enable use of the websocket (145) as through, for example, a web browser.

In operation, WS or WSS involves initiating the connection between client and server. Then, the client-server makes the handshaking and decides to create a new connection. This connection will be kept active until terminated by any of those computing devices. When the connection is established and kept alive, the communication will take place using the same connection channel until it is terminated. That connection may also be referred to in the art as the WebSocket.

Use of websocket (e.g., block (145)) in the present technology enables creating a network of machines with the websocket, where automatic or manual, user-directed, synching ensures that any computing device, user/stakeholder, or fabrication machine that is connected in the network always has the most current information to work from. This synching function of the fabrication center connector websocket (145) is denoted as "SYNC" in FIG. 2. Synching may occur on a preset schedule, or it may occur upon fabrication center (125) detecting the occurrence of any event such as a new computing device or fabrication machine connecting to the system (100) network (120). As will be appreciated by persons having ordinary skill in the art considering the entirety of the present disclosure, websocket (145) and its operation in the disclosed methods, systems, and related process is a key component piece of the present technology enabling the massive scalability of the model-to-machine concept and its application for remotely located users, computing devices, and fabrication machines to achieve the various advantageous technical and practical benefits and advantages as described herein. One such application the present technology may find particularly relevant and beneficial use, at least as of the filing date of this patent application, relates to "Industry 4.0," also known by the expression "Fourth Industrial Revolution," coined in 2016 by the founder of the World Economic Forum, Klaus Schwab. Another could be NASA, ESA and/or other national space agencies' or private companies' plans for colonization of Earth's moon or other planets or their moons.

The computer workstations (150) in the one or more fabrication shops (155) may be connected to individual fabrication machine(s) (110). These machines may be pipe or beam cutting, pipe or rod threading, or conduit (e.g., electrical, telecom) or pipe bending machines (110), among other types known to persons having ordinary skill in the art. In some examples, each of the machines (110) has its own motor control circuitry and also components (e.g., firmware) to receive signals for motor commands from the associated workstations (150). These commands may be generated and sent to the machines (110) based on file formats such as .csv, .rdb, .step, and .iges files, among 70+ other possible formats enabled from Autodesk® Forge connectivity, depending on the particular machines (110) and their requirements.

In some embodiments, system (100) includes a Fabrication Desktop (Machine Control) block (170) in communication with block (125) and the machines (110) via network (120). In conjunction with block (125) and block (145), block (170) may mediate control of machines (110) and enable data of and relating to the 3D model to be sent downstream to machines (110) with bi-directional feedback (e.g., 180a, 180b, . . . , 180n) communication between in-progress, current, and completed job items from the BIM models. All this data is tracked back to the initial building model which enables valuable insights for data to be stored (e.g., using MongoDB® (140) and/or database (141) that is dedicated to Fabrication Center (125) and/or to the system (100) as a whole and resides in or is otherwise associated with MongoDB® which may resides in a cloud either separate from, or integrated in, network (120)) that can be leveraged to complete future jobs more efficiently, repetitiously, and effectively.

Regarding MongoDB® or like database (140) as used in the present technology, in some embodiments, a database (141) that is dedicated to Fabrication Center (125) and/or to the system (100) as a whole may reside in (e.g., "on top of") or be otherwise associated with database (140), which may reside in a cloud either separate from, or integrated in, network (120). Data representative of the 3D model may be transmitted to database (140) and/or database (141). As explained herein, endpoints including workstation(s) (150) and any other computing machine of a user or stakeholder in the wider system (100) may view at least a portion of the data of the 3D model of a part or assembly of interest via the websocket (145). Any changes in any of the various data of, or derived from, the 3D model initially source from application (105) and/or fabrication tools application (115) that occur by any user of first computing device (130) or a third computing device (150), for example, may be detected by the fabrication center application (125) and/or the fabrication tools application (115). These data including any changes thereto relating to the 3D model or a view of it available to any users or stakeholder in system (100), may be captured as a state (165) of that 3D model. In the practice of the present technology, 3D model data may further include various other data inputs relating to fabrication of a part or assembly associated with the 3D model. Such other data may include, for example and without limitation, supplier ID, assembly state, due date, etc. for an associated fabrication process. Storing state (165) information in database(s) (140 and/or 141) enables any 3D model and/or fabrication process related data to be efficiently mapped and viewable, or otherwise usable, from anywhere by any credentialed user via the websocket (145). This may be considered as enabling an efficient multi-tiered operational protocol for an ecosystem of fabrication machines to thereby provide a technically enhanced, massively scalable, application of the model-to-machine concept. This further represents a substantial technological improvement to, and practical application in, model-to-machine operational techniques over the conventional systems, methods and processes as described above, for example, with reference to FIG. 1.

In some embodiments, all data of the 3D model that users and stakeholders of system (100) may interact with through websocket (145) and/or fabrication center application (125) may be mapped to the system (100)-specific database (141) sitting on top of a wider database (140) (e.g., MongoDB®). Again, this ensures that at any given instant in time, and at any location, any user of any device connected to network (120) is able to be assured that what data they will see, utilize, or otherwise leverage for a fabrication process is current. Database(s) (140 and/or 141) as used according to the present technology may also store and maintain change logs, user credentials, and other related useful information that may be of interest to system (100) users and stakeholders. This represents an improvement in the use of a database as compared to the conventional methods, systems and related processes as are described, for example, above with reference to FIG. 1.

In the convention system (1) as described above with reference to FIG. 1, a 3D model may communicate related data via the Internet to Forge®, which resides in the cloud. This may enable remote sharing of 3D model related data by users that are geographically dispersed. The conventional process or system (1) may utilize databases like MongoDB® (20).

In some embodiments, the fabrication tools application (115) according to the present technology may sit on top of a 3D model (e.g., a Revit® model) as a plugin. The state (165) of the model 3D may be modified from a variety of sources such as any of computer(s) (130, 150 and/or 126). These changes may be communicated to and from the involved computing devices via the websocket (145), the state (165) may immediately reflect those changes, and a modified state (165) is made immediately available to be stored and maintained in database(s) (140 and/or 141).

In an example, these aspects of the present technology may begin upon a designer using the fabrication tools application (115) "publishing" a 3D model (which may include modifications such as an associated "enhanced cut (or bend) list," to the fabrication center application (125), where, in some embodiments, such "publishing" may be mediated or facilitated by a network (120) connected subsystem (135) such as Forge®. In other embodiments, Forge® (135) may not be connected to network (120) and, instead, fabrication center (125) may retrieve the needed data about the 3D model from database(s) (140 and/or 141), which is connected to both application (125) and to Forge® (135) via a separate and distinct network (not shown in FIG. 2). Likewise, fabrication process-related data (estimated time of completion, per bend/cut charges for use of the fabrication center application (125) with the fabrication desktop application (160)) may be communicated to database(s) (140 and/or 141) via websocket (145)

Such a continuous feedback loop process according to the present technology that is bidirectional, is enabled and mediated by the unique application of websocket (145), and also involves computing device(s) (150) having machine control application for controlling fabrication machine(s) (110) is among the technical improvements to, and practical applications in, to fields of industry that utilize the model-to-machine concept. It also enables fabrication center application (125) to compute and/or track data pertaining to key performance metrics (KPIs) and charging or invoice related information, as in a productivity based billing scheme for users of system (100).

Figure 3:
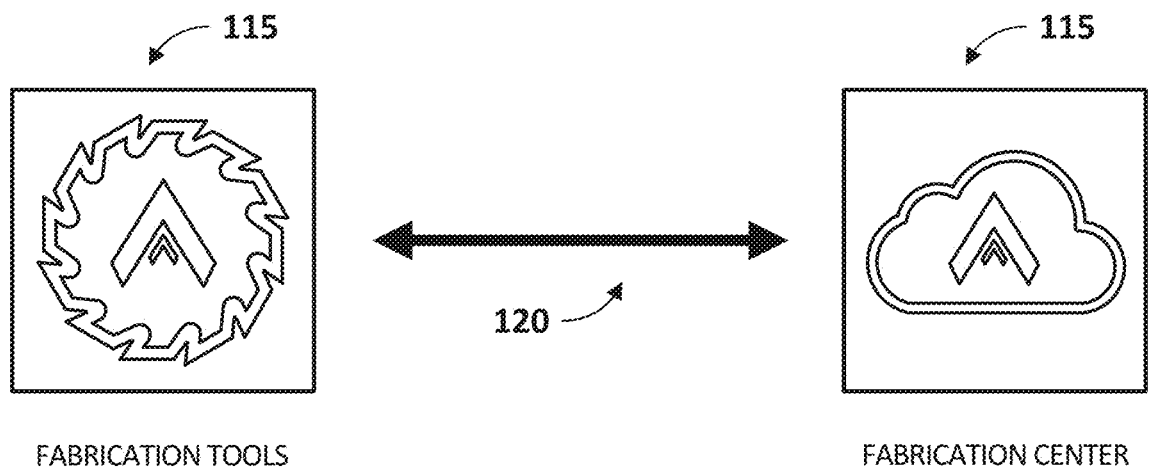
FIG. 3 is a diagram showing communication and data flow in the system of FIG. 2, according to some embodiments of the present technology.

Fabrication Tools:

As shown in FIG. 3, and with further reference to FIG. 2, the Fabrication Tools block (115) may communicate with the Fabrication Center block (125) via the network (120). In some embodiments, block (115) may be a plug-in application providing advantageous features and functions according to the present technology to 3D modeling software (105) such as Revit®. Similarly, block (160) may be a plug-in application providing advantageous features and functions according to the present technology to a fabrication machine (110) machine control software application such as TigerStop®, BendWorks®, and the like.

Figure 4:
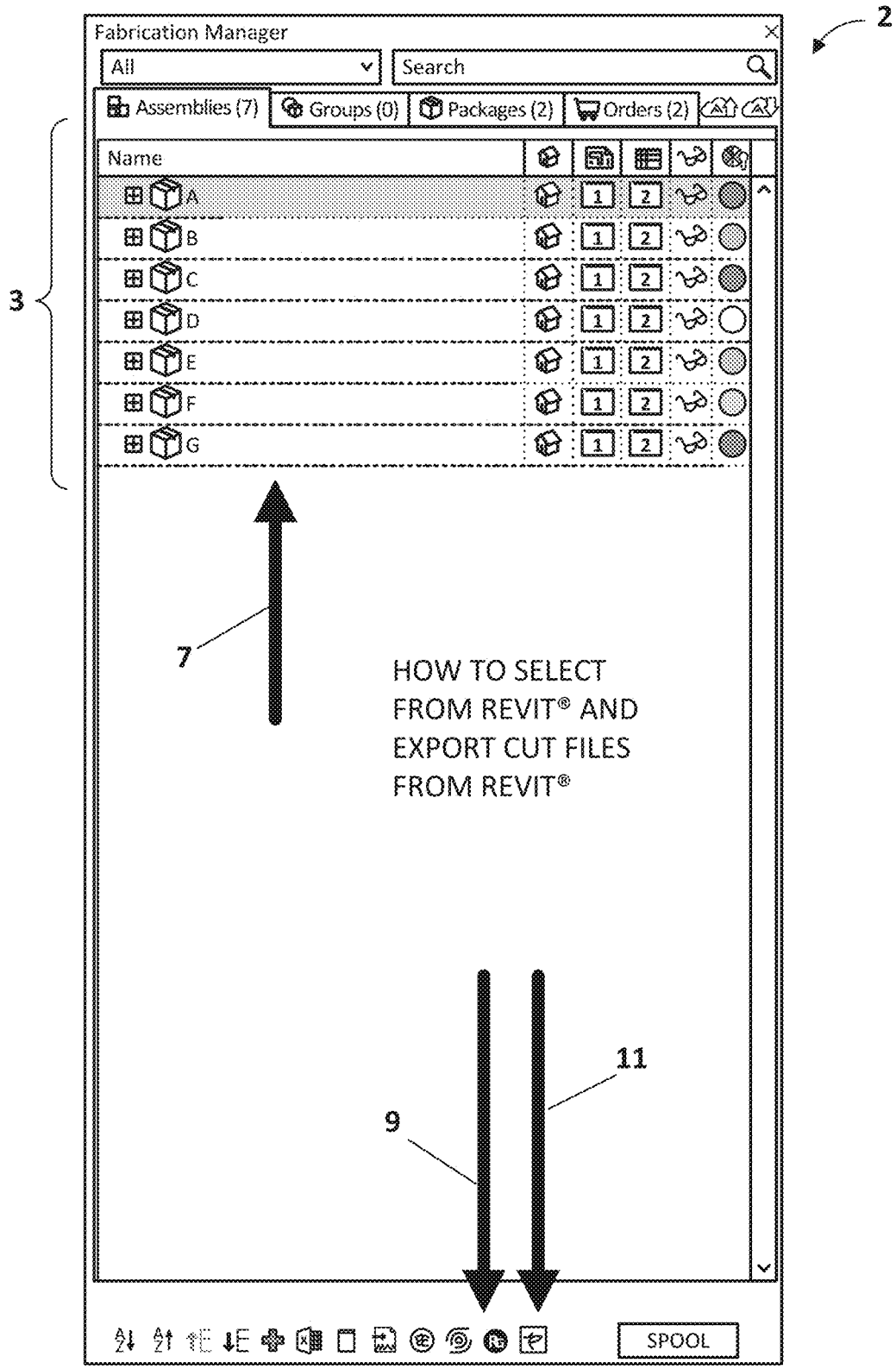
FIG. 4 depicts a Fabrication Manager window of the Revit® 3D modeling software.

FIG. 4 depicts a Fabrication Manager window (2) of the Revit® 3D modeling software (105). The "Assemblies" tab of window (2) is selected, and a listing of assemblies (3) A-G are shown. A user of Revit® may perform a cursor action (7) to select an assembly from the listing of assemblies (3). Next, the user of Revit® may perform cursor action(s) (9 and/or 11) to export cut files from the 3D modeling software (105) to the Fabrication Center block (125). This exporting may further include transferring one or more of at least a portion of the 3D model, the assemblies, and the BIM model in its entirety. Collectively, exporting data from the 3D modeling software (105) to block (125) according to the present technology may be referred to herein as publishing, which may include incorporating/integrating the 3D model and associated data to BIM 360®, on top of which the Fabrication Center block (125) may sit.

Figure 5:
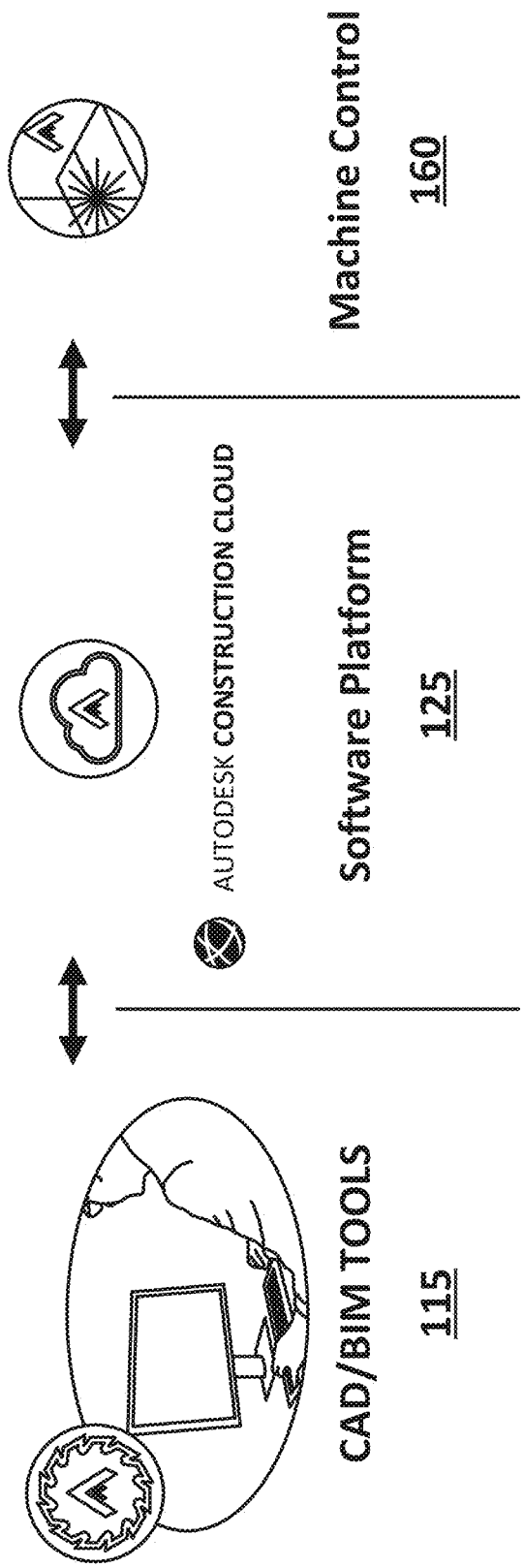
FIG. 5 depicts a communication and data flow scheme for the Fabrication Desktop and Fabrication Center blocks of the system shown in FIG. 2, according to some embodiments of the present technology.

Fabrication Center:

As shown in FIG. 5, and with further reference to FIGS. 2, 3 and 4, the Fabrication Center block (125) of system (100) communicates with Fabrication Tools block (115) and may further communicate via network (120) with the 3D modeling software (105) along with MongoDB® (140). In the case where 3D modeling software (105) is an Autodesk® application such as Revit®, for example, MongoDB® (140) may provide, but not save, the viewing component for use by Fabrication Center block (125) as well as Fabrication Desktop application block(s) (160). Assemblies may be viewed at workstation(s) (150) in the fabrication shop (155) though application block(s) (160). This advantageous feature of system (100) enables MongoDB® (140) to retrieve the state (165) necessary to carry out the additional unique and technically beneficial functions according to the present technology. The aforementioned features also enable publishing a result from the exporting of the data from 3D modeling software (105) to block (125), which enables a near instant load of the model data to the machine controller, a process that, in known systems, methods and software, generally took hours of mapping data fields to get the cut (or bend or threading) list data into the machine.

Figure 6:
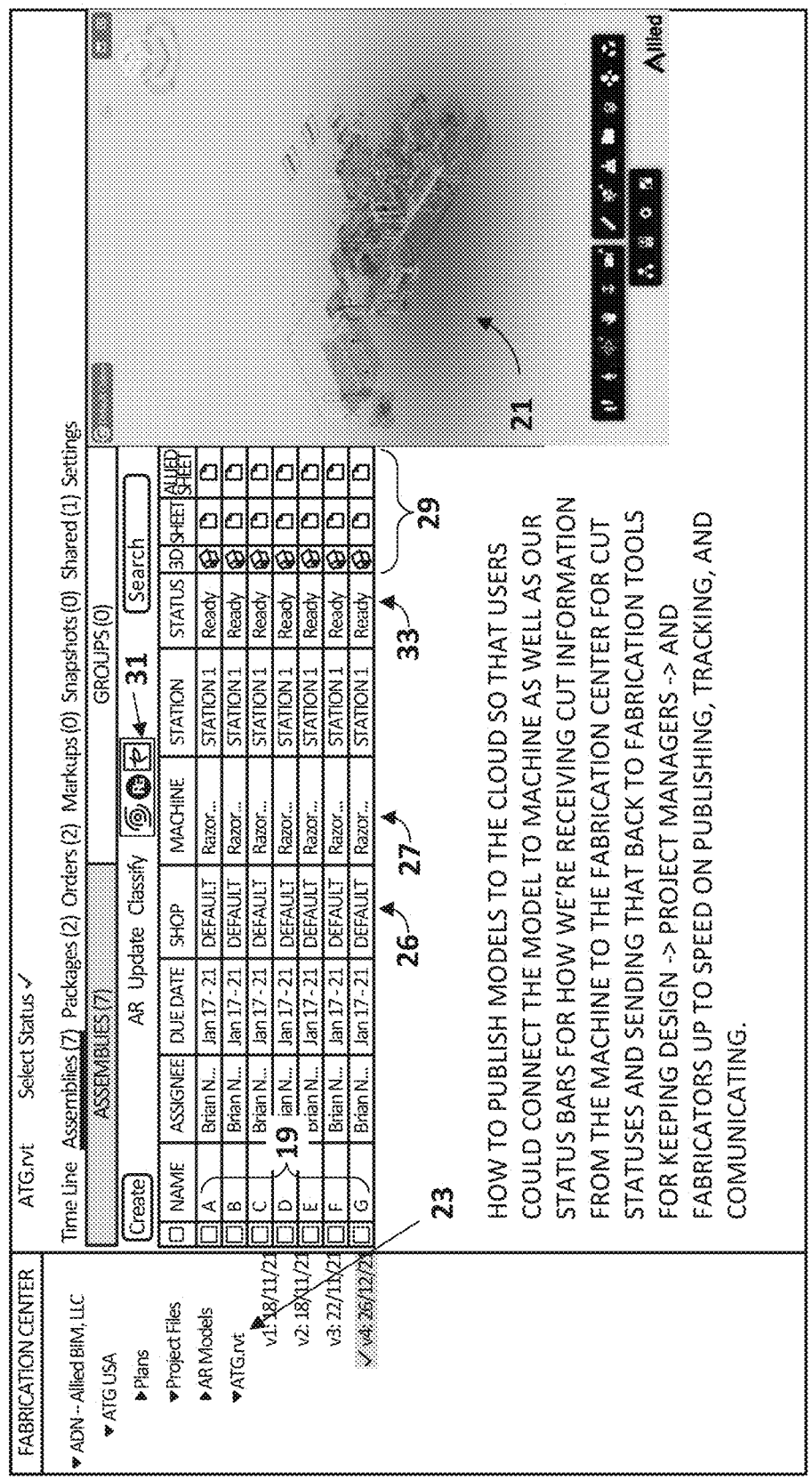
FIG. 6 depicts a Fabrication Center window of the system shown in FIG. 2, according to some embodiments of the present technology.

FIG. 6 depicts a window (17) including a web application graphical user interface (GUI) of the Fabrication Center block (125). Each of the various windows disclosed herein according to the present technology may considered to be GUIs. In an example, such a GUI may be generated and caused to be displayed by the fabrication desktop block (160) on an electronic display device of workstation computer (150). In another example, such a GUI may be generated and caused to be displayed by the machine control software resident on the workstation (150), either on its own, or in collaboration with block (160). In either case, the aforementioned GUI may include a human viewable and, in some embodiments, interactive table representation of the enhanced cut (or bend or threading) list according to the present technology.

Window (17) shows assemblies A-G from the listing (3) shown in FIG. 4. In some embodiments, window (17) provides a listing (19) of the assemblies with enhancements according to the present technology. Additionally, the state (165) and/or other data about the 3D model retrieved from MongoDB® (140) may be retrieved from Forge® (135) and then by block (125) to enable the 3D model (21) and assemblies thereof to be viewed by a user in window (17). Having received the 3D model and assembly data from the Fabrication Tools block (115), a user may perform cursor/click actions (31) to publish models and/or assemblies to the cloud so that other users can connect the model or assembly to a fabrication machine (110) via block (145) and network (120).

As shown in FIG. 6, window (17) may include a file directory (23) including, for example and without limitation, a listing of filenames and specific timestamped versions of Revit® 3D model files (.rvt). In the illustrated example, a user selecting "v4" of the highlighted .rvt file results in the associated assemblies A-G populating listing (19) in a row/column table format in window (17). A "shop" column (26) allows a user to select and assign a particular fabrication shop (155) for manufacturing a particular assembly. A "machine" column (27) allows a user to select and assign a particular machine (110) at a shop (155) for manufacturing the assembly. A set of columns (29) enables the user to view the 3D model (e.g., 21), a sheet, or an enhanced sheet (e.g., "Allied Sheet") in the same window (17) for a particular assembly. For example, and without limitation, users of the web application of the Fabrication Center block (125) may view the entire model and isolate individual assemblies. Features of the present technology such as these enable "enhanced cut (or bend or threading) lists" that are not provided by known systems, methods and software, and beneficially enables a user such as a project manager to use at least a portion of features of 3D modeling software (105) (e.g., view and rotate the entire model and/or individual assemblies, and view annotation data or metadata thereof) without having the software (105) locally installed on their computer.

With the shop, machine and possibly also a "station" in situations where a shop (155) includes multiple instances of a particular type of machine (110), selected in window (17), the user may proceed to click one or more of the button(s) (31) to publish the 3D model-related data to the cloud so that other users located anywhere in the world, or even in outer space, can connect to system (100) via network (120) to facilitate useful and technically advantages features for operating one of more of the machines (110) shown in FIG. 2 according to the present technology. After publishing, the users at fabrication shop(s) (155) may proceed with the fabrication job(s).

As previously mentioned, as fabrication job(s) proceed(s) from start to finish, status indicator(s) (33) for particular assembly(ies) may be updated and displayed to any appropriately privileged user via window (17). Data representative of statuses (33) for a fabrication machine (110) vis-à-vis its assigned to-be-fabricated part or assembly may be communicated by way of feedback (180) from the client application block (160) to the Fabrication Center block (125) via web socket (145) and block (170) using network (120). In some embodiments, MongoDB® (140) may be utilized to further facilitate communications between the fabrication shop (155) and the design team (or other stakeholders in a fabrication process involving the to-be-fabricated part or assembly).

Figure 7:
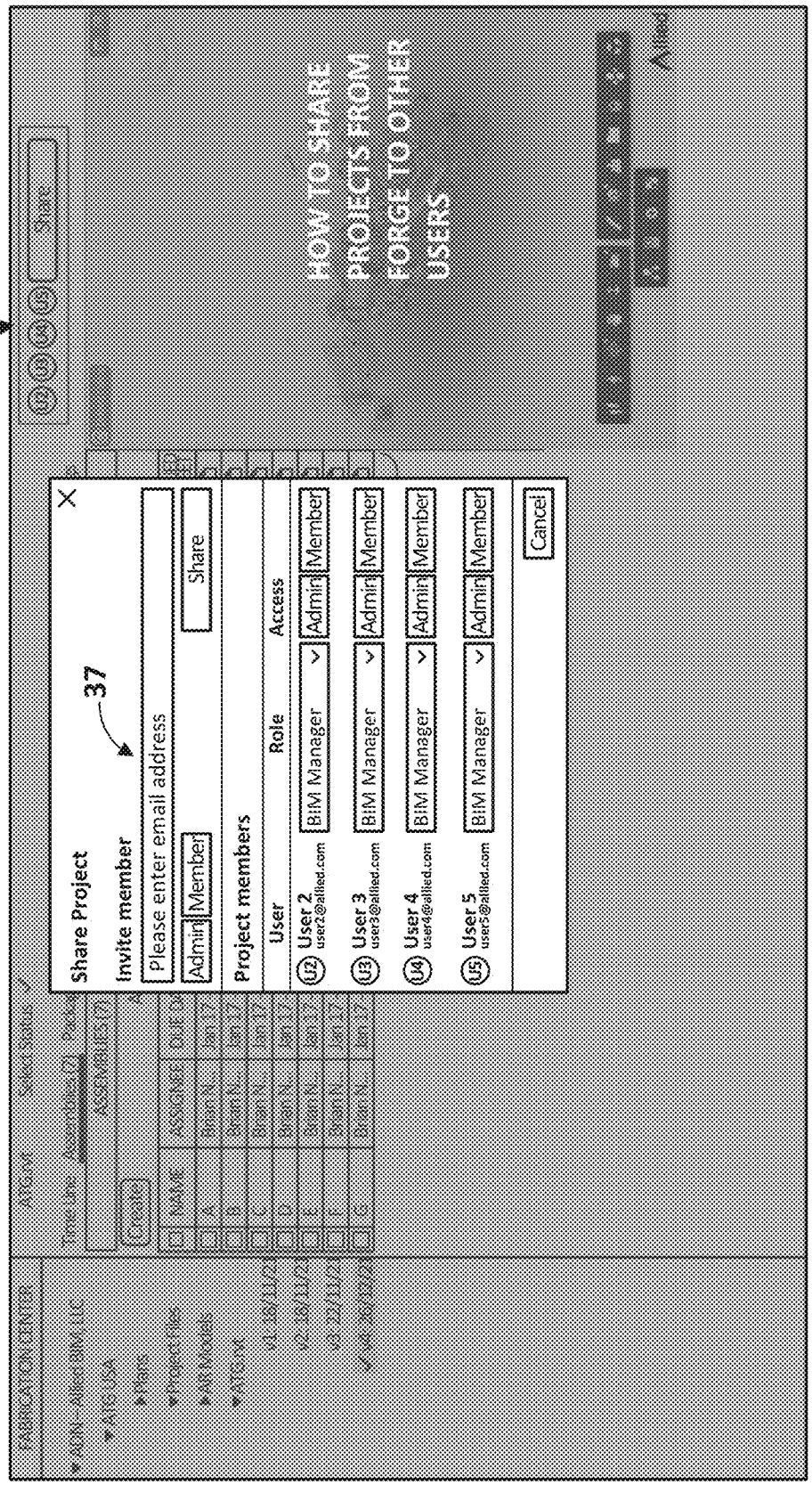
FIG. 7 depicts another Fabrication Center window of the system shown in FIG. 2, according to some embodiments of the present technology.

Assembly fabrication projects generated according to the present technology as described above with reference to FIG. 6 may be shared between Fabrication Center block (125) user and/or other users of Forge® (135). As shown in FIG. 7, for example, window (17) may include a set of clickable buttons (34) a user may click to provide a listing (37) of appropriately privileged users to appear over window (17). One or more of the users shown in listing (37) may then be selected to receive the published 3D model and its associated data. This technically advantageous feature of system (100) according to the present technology may enable a project manager to quickly provide the data for one or more of the assemblies to be fabricated to multiple shops (155) for purposes like bidding, determining availability or expected turnaround times, and/or assigning the work to a different shop in the event a prior assigned shop (155) or a machine (110) therein becomes unavailable.

Figure 8:
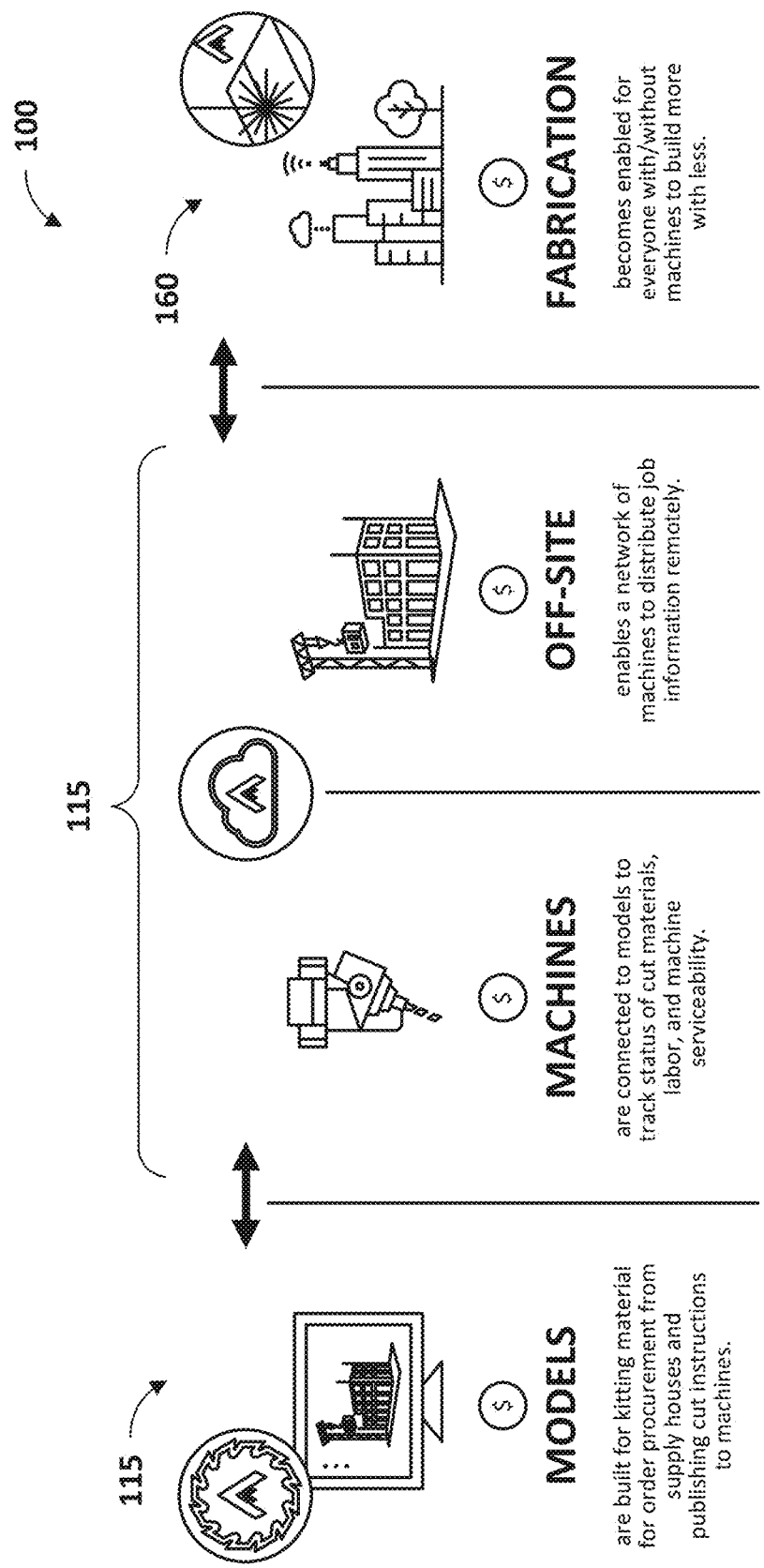
FIGS. 8 and 9 depict summaries of some of unique and technologically advantageous contributions and practical applications of the system shown in FIG. 2, according to some embodiments of the present technology.
Figure 9:
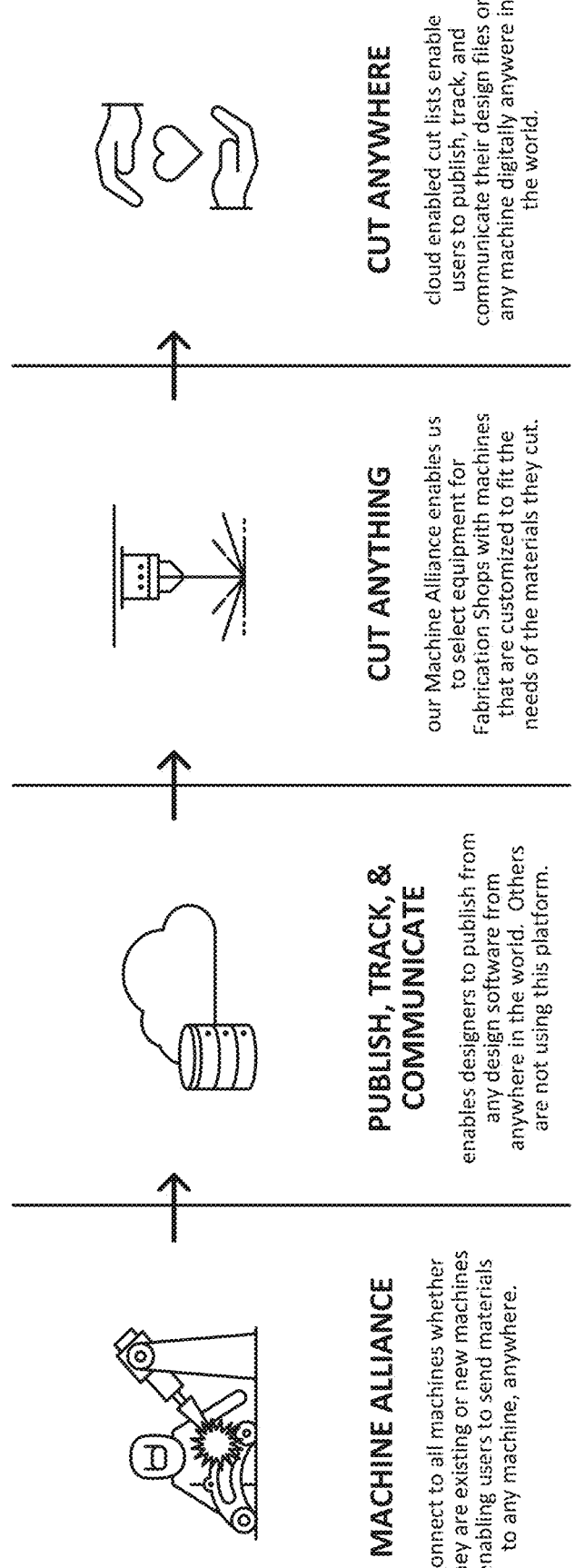

Referring to FIGS. 5, 8 and 9, to summarize some of the unique and beneficial contributions and practical applications of the systems and methods according to the present technology, system (100) is capable of taking a BIM coordinated model and enhancing it with, for example, enhanced cut (or bend or threading) lists, to provide further modeling to the BIM model and individual assemblies and parts thereof to package these data to facilitate downstream fabrication by machine(s) (110) in fabrication shop(s) (155). Notably, system (100) enables a full model to be broken into parts (e.g., assemblies) to the send to machines (110) capable of doing the necessary unit operations over a communications network (e.g., 120) in one or more fabrication shops (155) in any location remote from the designer at a separate computer (e.g., 130) running 3D modeling software (105). As such, the machines being connected to models (e.g., as shown in FIG. 8) in the present technology enables a more effective, efficient and streamlined technique for "model-to-machine" fabrication as compared to known systems, methods and software.

Figure 10:
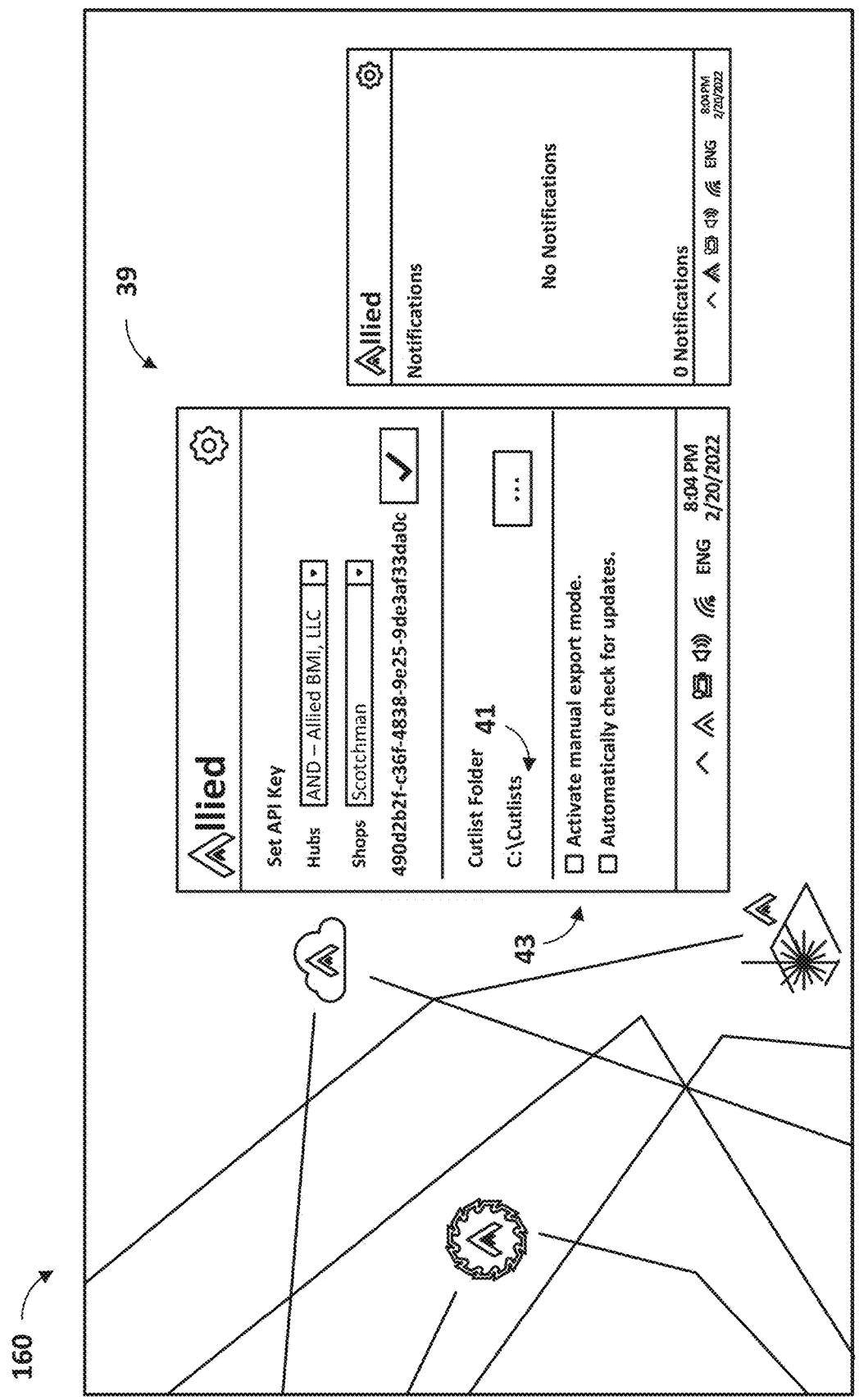
FIG. 10 depicts a Fabrication Desktop window of the system shown in FIG. 2, according to some embodiments of the present technology.

Fabrication Desktop:

As shown in FIG. 10, for example, a user in the fabrication shop (155) can open a browser window (39) on workstation computer (150) and login to the Fabrication Desktop application (160) of system (100) to flow the enhanced cut (or bend or threading) lists down from the Fabrication Center cloud application (125) via the web socket (145). In some embodiments, window (39) is a means for a user to login and connect computer (150) to the web socket connector block (145). A login process may set an application programming interface (API) key. In some embodiments, an output of the Fabrication Center block (125) may be the aforementioned enhanced cut files of the published model. The enhanced cut files can be read by the Fabrication Desktop application block (160).

During the login process using window (39), the user may select a directory (41) on the hard drive of the workstation computer (150). Using window (39), the user of the Fabrication Desktop application block (160) may select a checkbox (43) to activate a manual export mode, which enables export of files to block (160) directly from the 3D modeling software (105) as, for example, when a shop has yet to configure one or more of its machines (110) fully for use with system (100). The mode may enable block (160) to utilize data for machine control-related functions in system (100) without use of web socket (145).

As shown for example, in FIGS. 11-16, Fabrication Desktop application (160) may integrate with a machine control program such as, for example and without limitation, TigerStop®, RazorGage®, or BendWorks®. Features of those two example software packages are expected to be familiar to those having ordinary skill in the art and are not described in detail herein. Rather, the technical enhancements of the features and functions of the systems, methods and software according to the present technology (e.g., system (100)) are provided. In some embodiments, the input of enhanced cut (or bend or threading) lists may have category divisions according to stock material type (e.g., pipe vs. conduit vs. strut), sizes, dimensions, machine (110) (e.g., cutting vs. bending), assigned fabrication shop (155), and possibly other useful information. In system (100) according to the present technology, the BIM model may contain a list of such categories. The Fabrication Center block (125) allows a user to drill down into different categories to distribute information to specific shops (155) and/or machines (110). Referring again to FIG. 2, in some embodiments, a single fabrication shop may be a facility having each of the machines (110a, 110b, . . . , 110n). In other embodiments, two or more of machines (110a, 110b, . . . , 110n) may be distributed across a plurality of disparate fabrication shop (155) locations.

In an example, the information contained in the enhanced cut (or bend or threading) lists according to the present technology may be used to generate and send material procurement orders for suppliers to ship directly to assigned fabrication shops (155). In some embodiments, additional enhancements may be provided to the input enhanced cut files by the Fabrication Desktop application (160) to make them suitable for use by machines (110) without any, or with only minimal, further human intervention. However, Fabrication Center block (125) may be capable of delivering the enhanced cut files in a state and/or format that is ready for use by machines (110) with no further modification, which represents a substantial improvement in efficiency and user experience as compared to known systems, methods and software.

Figure 11:
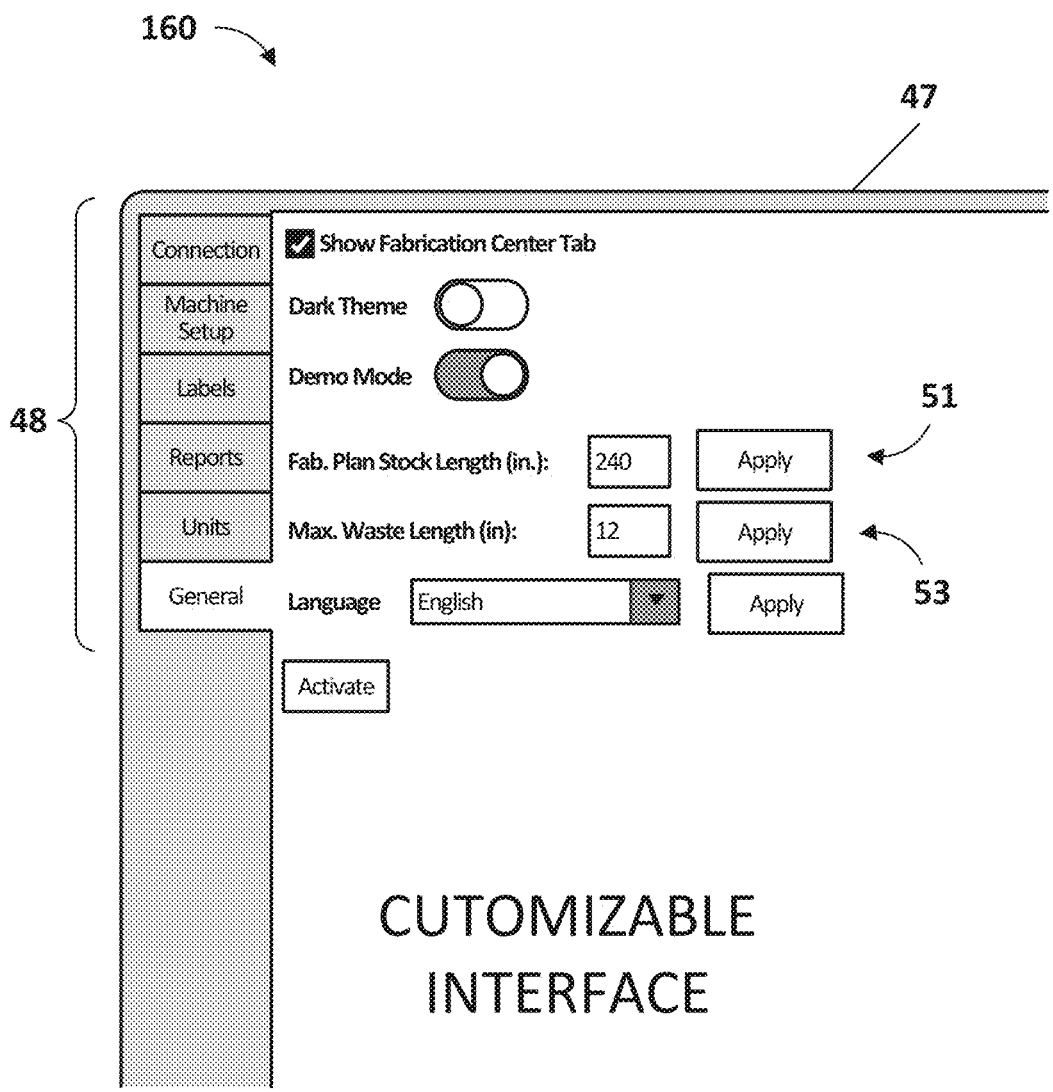
FIG. 11 depicts a Fabrication Desktop window of the system shown in FIG. 2, according to some embodiments of the present technology.

FIG. 11 depicts a window (47) of the Fabrication Desktop application (160). Window (47) displays a customization GUI and provides a set of tabs (48) to enter or adjust, and then apply, configuration settings for client application (160) to facilitate use by machine control software and connected machines (110) of the enhanced cut files and related 3D model data obtained from the Fabrication Center block (125) via the web socket (145). The window (47) includes a general tab (49). In the general tab (49), a stock length field (51) may enable a user of application block (160) to specify a length of the raw material stock, e.g., pipe, to be fed to a cutting machine (e.g., 110a). Similarly, a maximum waste length field (53) in the general tab (49) may enable a user of application block (160) to provide a limit on an uncut stock length of, e.g., pipe. This feature advantageously enables, possibly in conjunction with machine-specific firmware or its control software, intelligence to be applied in the enhanced cut (or bend or threading) lists to reduce waste. Thus, more linear cut lengths may be fit in an overall stock length as compared to known systems and methods. Furthermore, the absence of the need for keying in numerical values and other information at the actual machine (110) control computer workstation (150), or otherwise, substantially decreases the occurrence of costly human errors as compared to known systems, methods and software.

A further technically advantageous feature of system (100) according to the present technology is that the data (e.g., .csv format) of the enhanced cut (or bend or threading) lists provided from the Fabrication Desktop client application block (160) to the machine control software has an optimized order for the cutting and/or bending operations. For example, and without limitation, such optimization of ordering of unit operations may include minimizing unused material by minimizing material waste.

Figure 12:
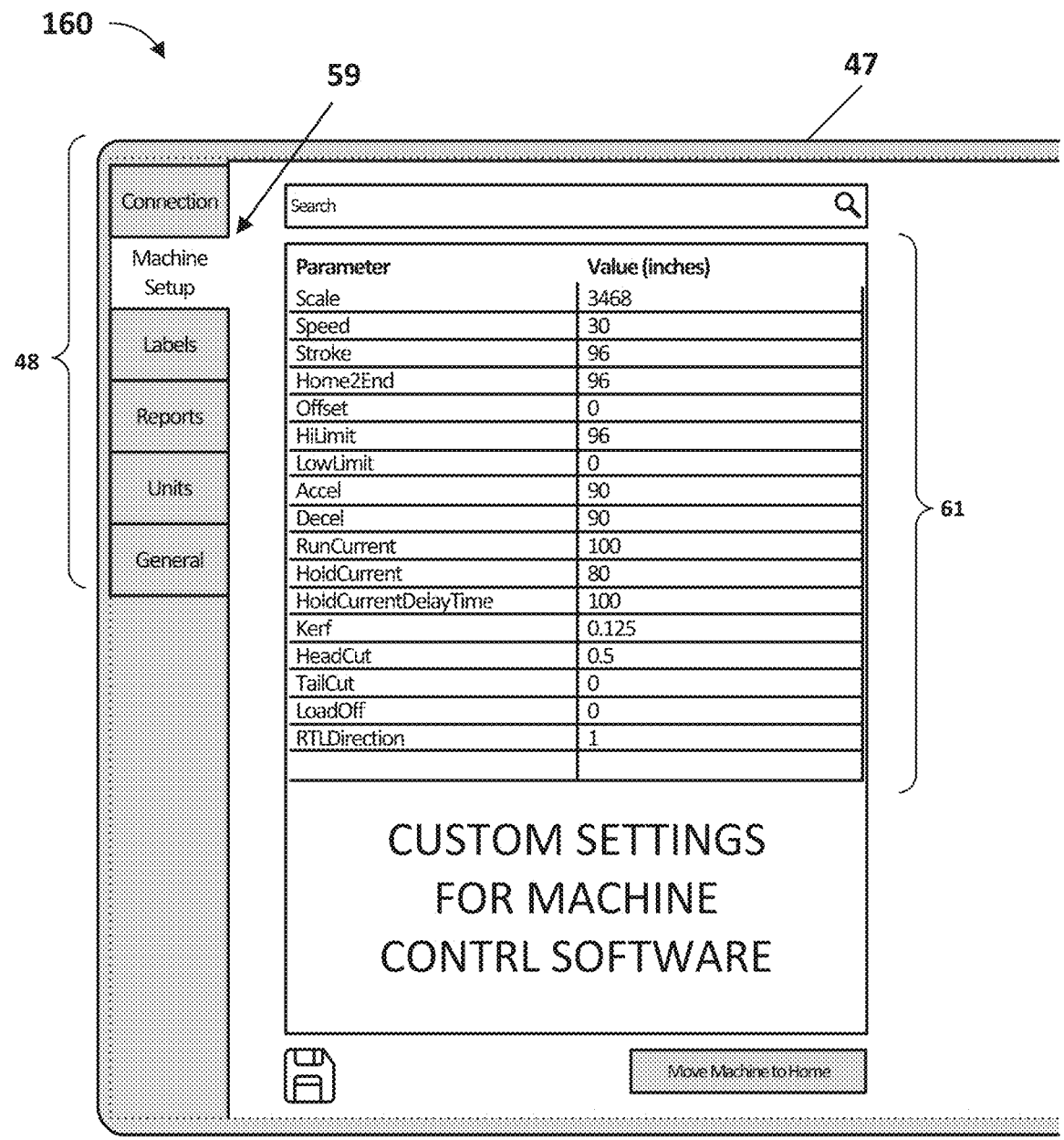
FIG. 12 depicts another Fabrication Desktop window of the system shown in FIG. 2, according to some embodiments of the present technology.

A .csv formatted enhanced cut file generated according to the present technology includes an assembly name, a size, a length, a part number, and material type. Referring now to FIG. 12, the aforementioned window (47) includes a Machine Setup tab (59) among the set of tabs (48). The Machine Setup tab (48) enables a user of block (160) to view and/or specify custom settings for the machine control software (e.g., TigerStop®). A table view (61) may be provided for this purpose. In another embodiment, not shown, a similar table view may be provided to allow a user of the Fabrication Desktop client application (160) to view and/or specify custom settings for the machine control software (e.g., RazorGage® or others).

Figure 13:
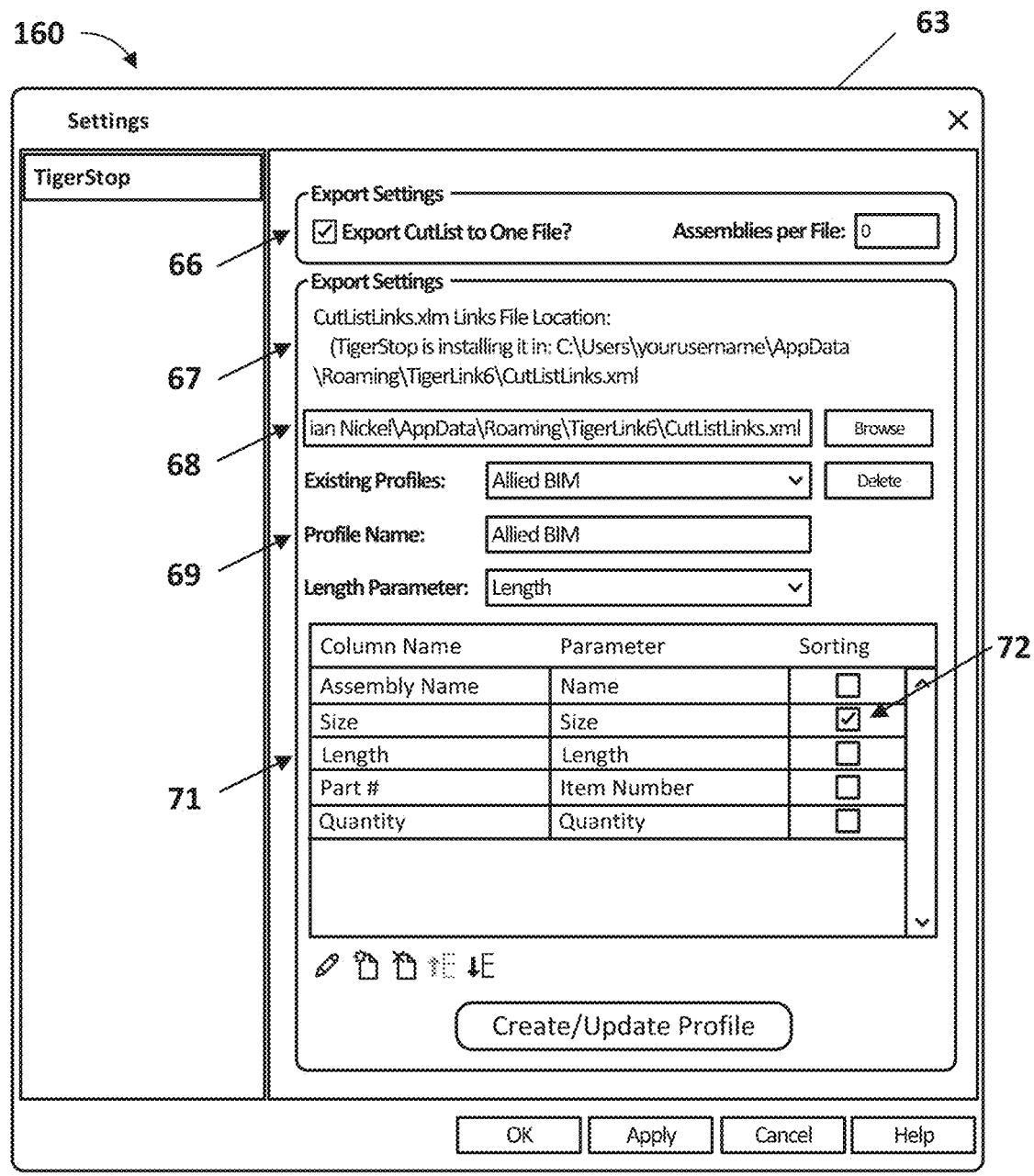
FIG. 13 depicts a Fabrication Desktop window of the system shown in FIG. 2, according to some embodiments of the present technology.

FIG. 13 depicts a Fabrication Desktop client application (160) TigerStop® settings window (63). Window (63) includes a checkbox (66) that a user may engage to specify that the enhanced cut (or bend or threading) list be exported to the TigerStop® machine control software as one file. Window (63) also includes a profile settings box (67) showing a file location where the .xml format cut (or bend or threading) list links files that a machine control software program (e.g., TigerStop®) may generate from the enhanced cut (or bend or threading) list files will be stored. Window (63) further includes a directory box (68) that enables a user of block (160) to specify the location where the .xml format cut (or bend or threading) list links files for use by the machine control software. A set of fields (69) in window (63) enables a user of the Fabrication Desktop client application block (160) to view and/or specify an existing profile, a profile name, and a length parameter. Window (63) also includes a table (71) with checkboxes (72) to enable the user to specify whether or not the enhanced cut (or bend or threading) list file will be sorted according to one or more of the parameters assembly name, size, length, part number, and quantity. In the example illustrated in FIG. 13, the checkbox (72) for size is checked, and so the file utilized by the machine control software will be sorted based on the sizes of the parts of the assembly to be fabricated.

Figure 14:
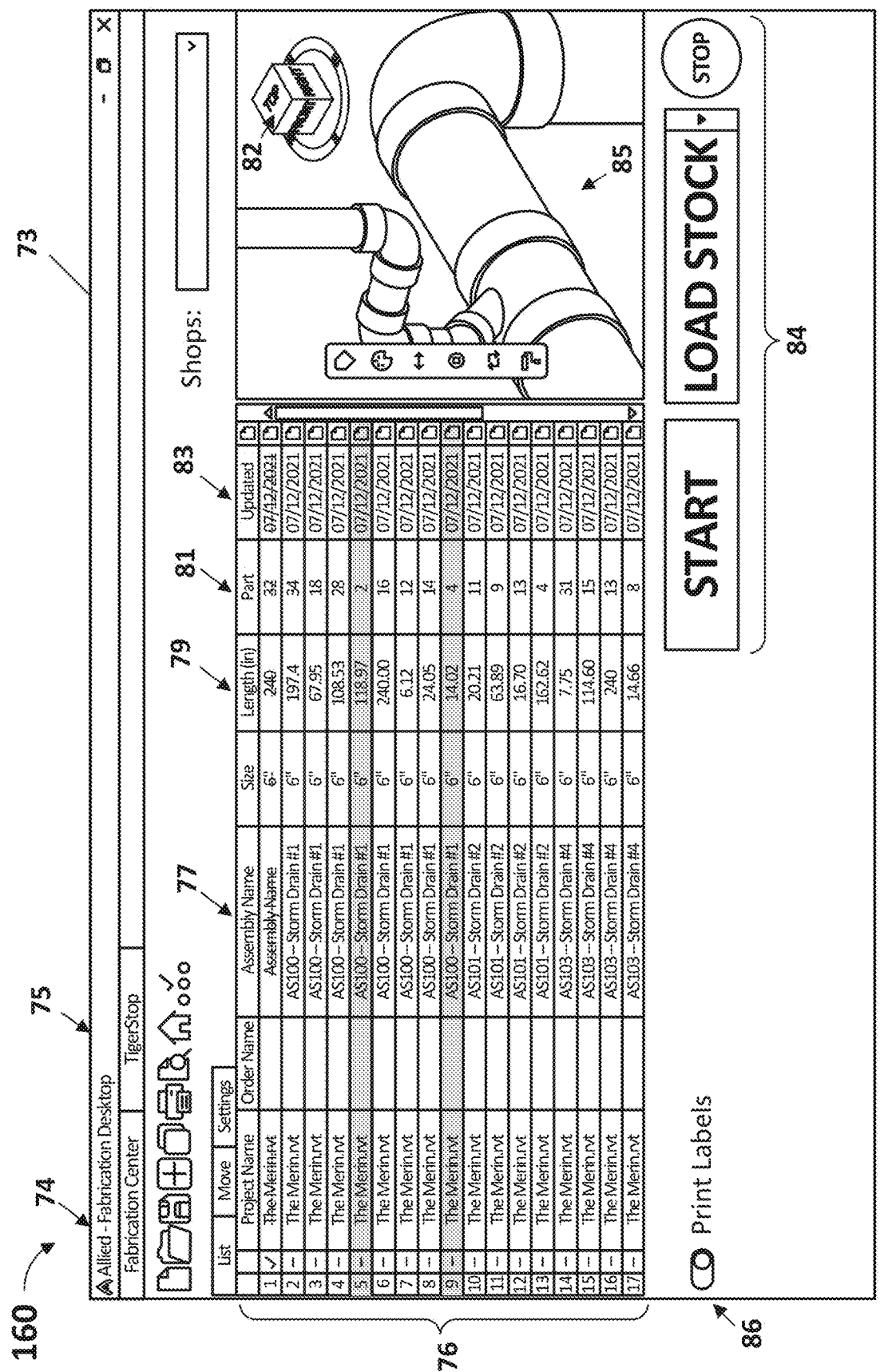
FIG. 14 depicts another Fabrication Desktop window of the system shown in FIG. 2, according to some embodiments of the present technology.

FIG. 14 depicts a machine control software (e.g., TigerStop®) window (73) of the Fabrication Desktop client application (160). In some embodiments, window (73) includes Fabrication Center (74) and TigerStop® (75) tabs. In the window (73) with machine control software (e.g., TigerStop®) tab (75) selected, a user may see a representation of the enhanced cut (or bend or threading) list in the form of a table view (76), which may be generated from the aforementioned .xml file(s). In the example shown in FIG. 14, three cut (or bend or threading) lists for three assemblies for a project named "The Merin.rvt" are presently displayed to the user in table view (76): "AS100—Storm Drain #1", AS100—Storm Drain #2", and "AS100—Storm Drain #4". The assemblies to be fabricated using the machine control software for a suitable machine (110) are provided in an assembly name column (77) of the table view (76). Taking the to-be-fabricated parts of assembly "AS100—Storm Drain #1" as an example, the enhanced cut (or bend or threading) list may be sorted according to the present technology not just according to lengths, but also per the above described optimization algorithm for reducing waste and mitigating safety risks. Accordingly, row 9 of the table view (76) includes in a length column (79) with the final piece of assembly "AS100—Storm Drain #1" being 14.06 inches, which provides that the waste piece conforms to the specified "max. waste length" field (53) value of 12 inches shown in FIG. 11. Table view (76) for the enhanced cut (or bend or threading) list file (e.g., single .xml file as specified by check box (66) in FIG. 13) also includes part number (81) and upload time/date stamp (83) columns. The various data provided in the columns and rows of the table view (76) from the .xml file correspond to these data in the .csv enhanced cut (or bend or threading) list, as described above.

In the system (100) according to the present technology, window (73) further enables the 3D model (85) of a selected assembly to be viewed and manipulated (e.g., rotated) using a cursor-controllable means (82) using the Fabrication Desktop client application (16) without the need for locally installed and licensed 3D modeling software (105) running on a workstation computer (150). This feature of the present technology may be enabled by the web socket (145) communicably coupled with the Fabrication Center block (125) via network (120). Window (73) may additionally include clickable control buttons (86) the machine(s) (110) connected to TigerStop® and assigned to complete the mechanical tasks for the fabrication of the assemblies in table view (76) according to the enhanced cut (or bend or threading) list. In the example shown in FIG. 14, the machine (110) control buttons (86) include clickable "Start", "Load Stock", and "Stop" buttons. Window (76) further includes a cursor activatable label control toggler (86) that enables a machine (110)-connected printer to include a label (90) on part(s) of fabricated assemblies that include useful and pertinent graphical and/or alphanumeric information as specified by the user with a label setting tab (91) of a window (92) of the Fabrication Desktop block (160), as shown for example, and without limitation, in FIG. 15.

According to the present technology, a machine control software application (e.g., Greenlee BendWorks®) that may be integrated or otherwise associated with the Fabrication Desktop application (160) may be capable of further optimizing aspects of the enhanced cut (or bend or threading) list above what known machine control software applications are capable of. Such optimization may include, without limitations, filtering by size; automatically placing shortest material up front, and the largest in the back; specify and account for safety and ergonomic considerations, as in tightly packing all cut lengths across stock, taking thought out of order of cuts previously entered manually by machine (110) operators, greater accuracy in procurement of material with less waste. In other words, and as compared to known systems and methods, embodiments of system (100) according to the present technology enable efficiencies like optimization of yield of material for waste reduction in addition to improvement of safety in the fabrication shop (155).

Figure 15:
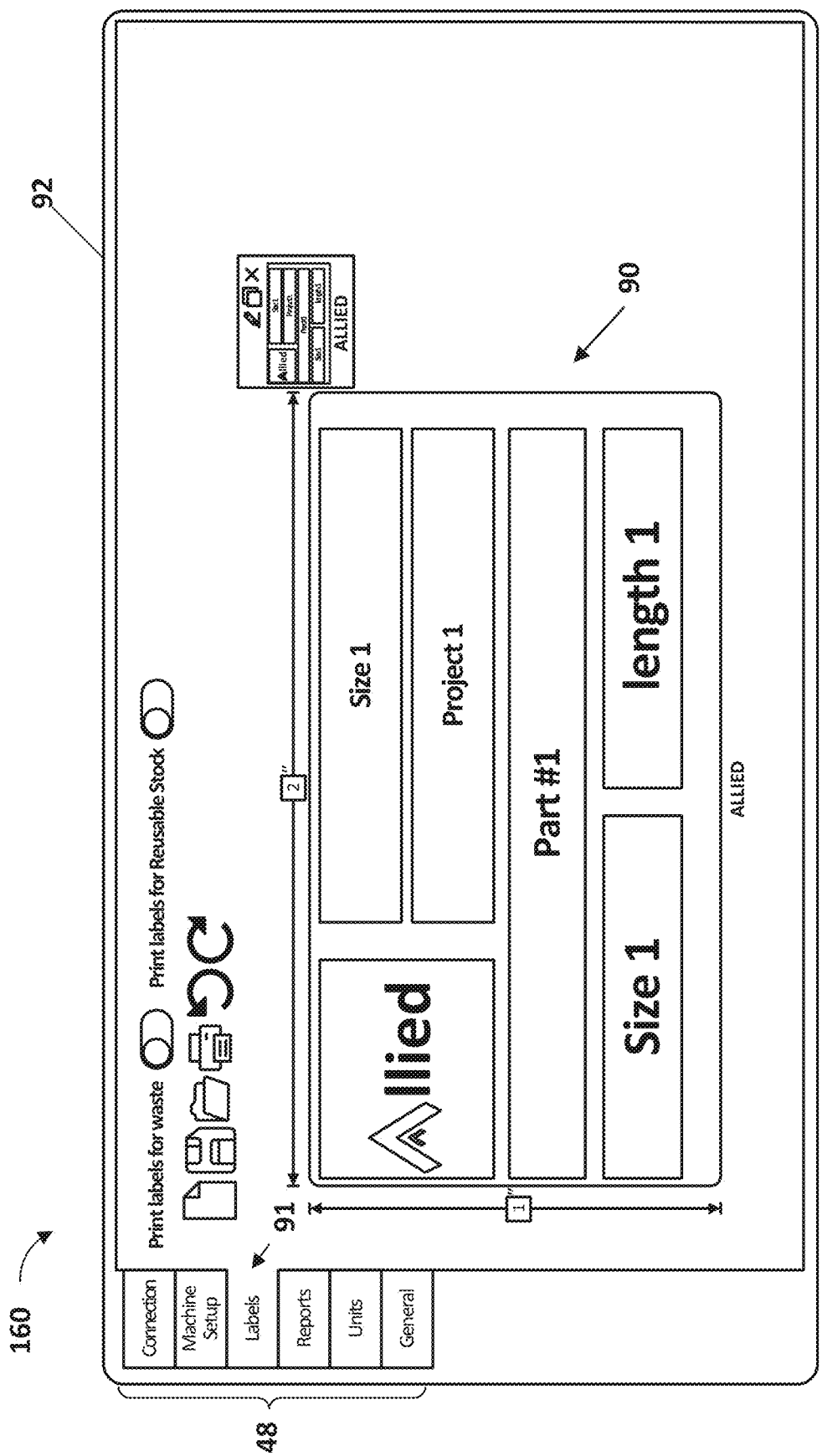
FIG. 15 depicts yet another Fabrication Desktop window of the system shown in FIG. 2, according to some embodiments of the present technology.

Several use cases will now be described in the context of some practical applications in the pertinent field of technology, including with reference to FIGS. 15 and 16. The present technology substantially improves both the field of technology and the operations of computers, communications networks, and associated machines and devices in the field. Various advantageous technical effects of the present technology have been hitherto described in detail. Additional technical effects are expected to become readily apparent to persons having ordinary skill in the art from study of the following examples and use cases.

Examples

Per the preceding description, users in fabrication shop (155) are enabled by the present technology to select parts or entire assemblies for fabrication or finishing. The present technology effectively nests and/or integrates (e.g., as a plug-in application or otherwise) with machine control software like TigerStop® and RazorGage®, and adds work management features like the aforementioned status updates and timely and useful feedback (180).

The present technology provides a simplified workflow for submitting cut (or bend or threading) lists to the cloud block (125) and on the machines (110). For this purpose, in some embodiments, the present technology may use a JSON API to create and serialize these files and associated data.

Figure 16:
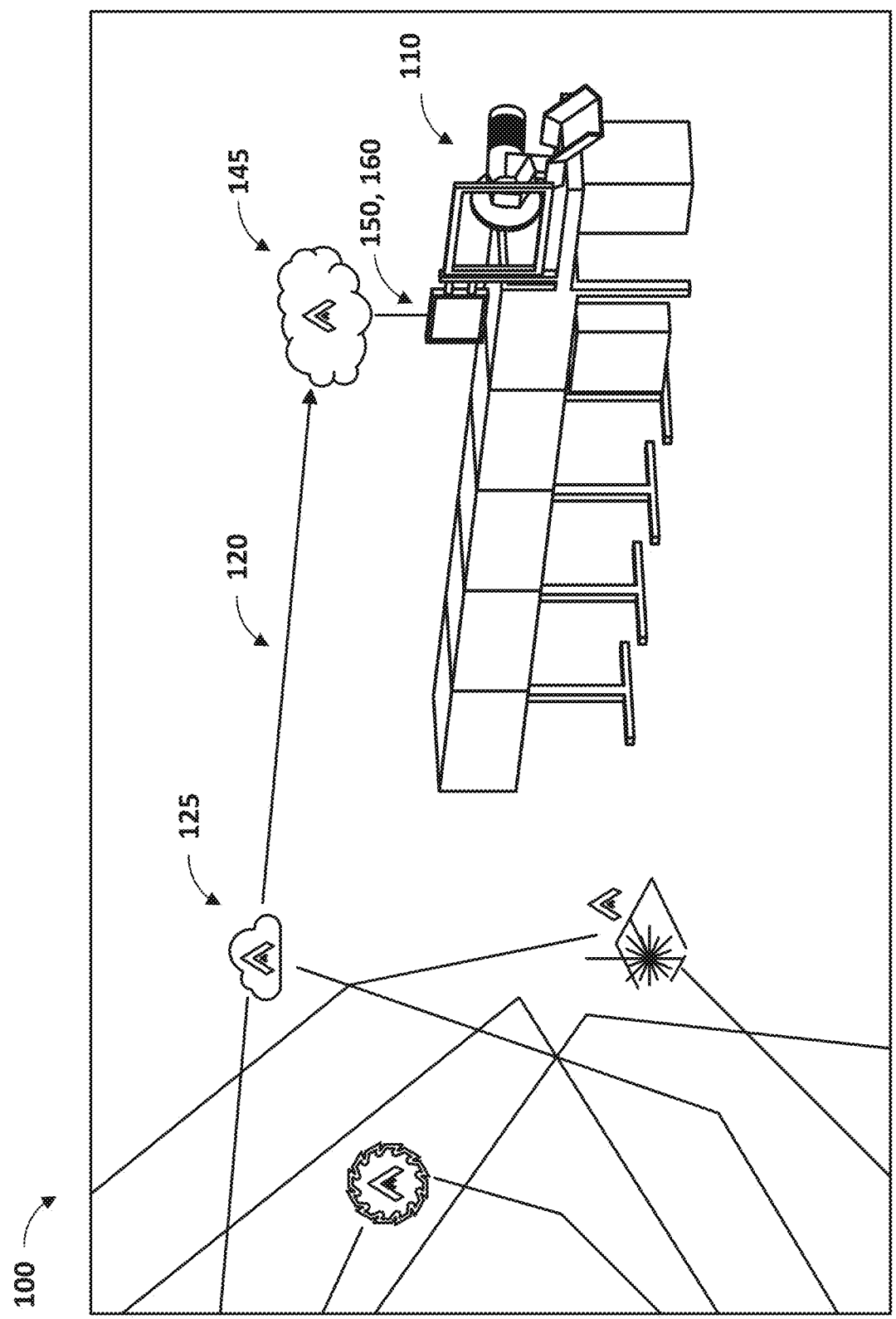
FIG. 16 depicts an example implementation and practical application of the system shown in FIG. 2, according to some embodiments of the present technology.

In one example, as shown in FIG. 16, the present technology enables connecting the 3D model and/or BIM model to Scotchman® fabrication machinery. According to this example, the present technology may enable at least the following advantageous technical effects to users and other stakeholders: added value and operational efficiencies to contractors; enable machine producers or distributors to sell more machine units; added accessibility for remote users or customers; expanded opportunities for sales in new demographics; adds value to specific machine types, models or lines.

In another example, as shown in FIG. 10, the present technology enables a desktop connector (e.g., web socket (145)) for Scotchman® machinery and RazorGage®. According to this example, the present technology may enable at least the following advantageous technical effects to users and other stakeholders: Cloud Cut List Enabled—Publish, Track, and Communicate cut lists to any machine in the world; and Gain insight into what is cut and when the job has been completed; Best-In-Class Dynamic Optimization—Eliminate raw material waste with dynamic optimization (nesting); the operator can simply load the cut (or bend or threading) list and sort by sizes to yield the least amount of waste using the state-of-the-art optimization algorithm of the present technology; Easy Labels—Label each part individually with part numbers, lengths, QR Codes, project, and assembly numbers. Stop fighting labels and make your label nightmares a thing of the past with EASY Labels, as shown for example and without limitation in the Fabrication Desktop block (160) window (92) of FIG. 15. The web socket (145) thus enables the "model-to-machine" workflow according to the present technology from any 3D modeling software to cut linear lengths from stock material directly on all Scotchman®-RazorGage® connected machines.

Several additional use cases are provided below in Tables I-V. Table I describes problems experienced by such shops (155), solutions and advantageous technical effects to provide practical applications addressing such problems, and associated opportunities, provided by the present technology.

TABLE I

Use Case #1, Fabrication Shop-TigerStop/RazorGage Enabled

| Problems | Solutions |
| --- | --- |
| Creating Assemblies | Create Views & Sheets Simultaneously |
| Creating Sheets | Automatic Tagging Assemblies To Speed |
| Creating Tags | Up Tags On Sheets |
| Annotating Sheets | Instant 3D Spooling With Fabrication |
| 1,000's of Spools Per Job | Center |
| Fabricator Oftentimes Can't Understand 2D Spool Drawings | Directly Connect Design To Fabrication Shops Machinery |
| Opportunity: Fabrication Desktop Can Run These Machines And We Can Sell The Machine Control Software Which Enables Opportunities For Selling Tools & Center | Allocate Your Spooling Time To Cutting Time Machine Performs Cuts And Workstations Run Fabrication Center Models To Understand Design Intent In 3D |

Table II describes a use case for a fabrication shop (155) having Low Utilization Machinery having positioner(s). Table II describes problems experienced by such shops (155), solutions and advantageous technical effects to provide practical applications addressing such problems, and associated opportunities, provided by the present technology.

TABLE II

Use Case #2, People With Low-Utilization Machinery With Positioner

| Problems | Solutions |
| --- | --- |
| Machine Is Low Utilization<br>Machine Is Not Cutting Or Bending<br>Machine Is Collecting Dust<br>Individual Is Inefficient At Planning Work<br>Trade Labor Shortage<br>Opportunity: Companies Can Enable Their Existing Machines To Be Tied Into The ALLIED (https://www.alliedbim.com/) Network Of Machines | Connects To Existing/New Tigerstop/RazorGage/Greenlee Machinery<br>Enables Saving Custom Lists For Continued Cutting Or Bending<br>Protects Your Company From Economical Losses And Accidents<br>Directly Enables Connection From Design To Fabrication Shops Machinery<br>Allocate Your Spooling Time To Cutting Time<br>Machine Performs Cuts And Workstations Run Fabrication Center Models To Understand Design Intent In 3D<br>Users Can Enable Work Availability Mode<br>Users Can Share Cut (or bend or threading) Lists With Other Companies<br>Users Can Bid Other Fabrication Jobs To Provide Work For Idle Machinery |

Table III describes a use case for a designer using 3D modeling software (105) without any third-party plugin tools. Table III describes problems experienced by such users of such software (105), solutions and advantageous technical effects to provide practical applications addressing such problems, and associated opportunities, provided by the present technology.

TABLE III

Use Case #3, Designer-No Third-Party Plugin Tools

| Problems | Solutions |
| --- | --- |
| Creating Assemblies | Create Views & Sheets Simultaneously |
| Creating Sheets | Automatic Tagging Tools To Speed Up |
| Creating Tags | Tags On Sheets |
| Annotating Sheets | Instant 3D Spooling With Fabrication |
| 1000's Of Spools Per Job | Center |
| Fabricator Oftentimes Can't Understand 2D Spool Drawings | Directly Connect Design To Fabrication Shops Machinery |
| Opportunity: ALLIED BIM's Fabrication Software Gets Them Started With The Process By Immediately Speeding Up Their Solving Of Out Of The Box Revit Problems | Allocate Your Spooling Time To Cutting Time<br>Machine Performs Cuts And Workstations Run Fabrication Center Models To Understand Design Intent In 3D |

Table IV describes a use case for a designer using third-party tools with BIM 360®. Table IV describes problems experienced by such designers, solutions and advantageous technical effects to provide practical applications addressing such problems, and associated opportunities, provided by the present technology.

TABLE IV

Use Case #4, Designer-Uses Third-Party Plugin Tools With AUTODESK BIM 360

| Problems | Solutions |
| --- | --- |
| SysQue ®-No Connection To Machinery In Fabrication Shop<br>EVOLVEMEP ®-No Connection To Machinery In Fabrication Shop<br>GTP STRATUS ®-Weak Connection To Machinery In Fabrication Shop<br>Export Cut (or Bend or Threading) Lists To CSV File For Loading Machinery In Fabrication Shops Which Disconnects Data And Causes Chaos On Fabrication Shop Floor<br>Opportunity: Fabrication Center May Be Hosted On BIM 360 App Store And Works With BIM 360/ACC Enabling Users To Distribute Models To Machinery | Works With System Families And Fabrication Parts<br>Enables Model To Machine Connection Opportunities For Assistance In Setting Up Design Departments<br>Don't Have Native Revit ® Spooling Tools Directly Connect Design To Fabrication Shops Machinery<br>Allocate Your Spooling Time To Cutting Time<br>Machine Performs Cuts And Workstations Run Fabrication Center Models To Understand Design Intent In 3D<br>Content Curated By Virtual Building Supply |

Table V describes a use case for a designer shop (e.g., general contractor) without an in-house fabrication shop (155) having machine automation. Table V describes problems experienced by such designers, solutions and advantageous technical effects to provide practical applications addressing such problems, and associated opportunities, provided by the present technology.

TABLE V

Use Case #5, Design Shop Without Fabrication Shop-No Machine Automation

| Problems | Solutions |
| --- | --- |
| Don't Have A Fabrication Workflow<br>Want To Expand To BIM And Don't Know How<br>Have An Existing Design Department And Want To Connect To Fabrication Shop But Don't Know How<br>Opportunity: ALLIED BIM Can Help Select Machines And Can Provide The Machine Control Software Which Enables Opportunities For Selling Tools And Center | Connects To Existing/New TigerStop/RazorGage/Greenlee Machinery<br>Enables Saving Custom Lists For Continued Cutting<br>Accounts For Safety<br>Directly Connect Design To Fabrication Shops Machinery<br>Allocate Your Spooling Time To Cutting Time<br>Machine Performs Cuts And Workstations Run Fabrication Center Models To Understand Design Intent In 3D |

FIGS. 17-28 depict flow charts of a method (300) for utilizing information of a 3D modeling software package (105) to facilitate operation of fabrication machines (110), which may be used with the system (100) described above with reference to FIG. 2, according to some embodiments of the present technology. To aid in understanding of the various embodiments of the method (300) as shown in FIGS. 17-28, various features labeled in one or more of FIGS. 2-16 may be referred in the below description of method (300). In FIGS. 17-28, circled letters denote continuations and/or transitions between the figures.

Figure 17:
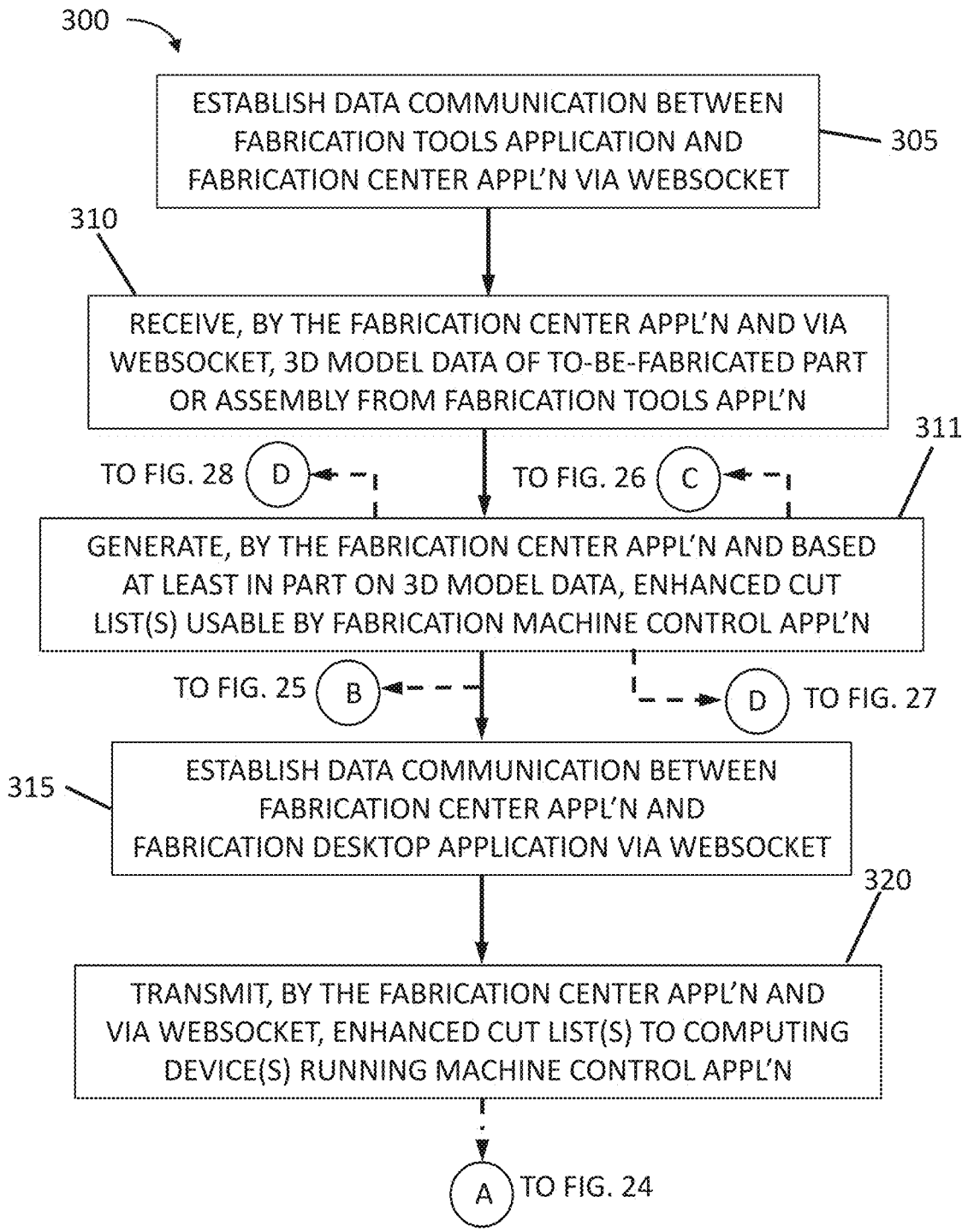
FIGS. 17-28 depict flow charts of a method for utilizing information of a 3D modeling software package to facilitate operation of fabrication machines, which may be used with the system of FIG. 2, according to some embodiments of the present technology.

Referring to FIG. 17, the method (300) executed on at least one computing device to facilitate operation of one or more fabrication machines using digitally stored part or assembly information of a three-dimensional (3D) modeling application (105). The method (300) may include the step of establishing (305), e.g., by fabrication tools application (115) associated with 3D modeling application (105) running on a first computing device (e.g., 130), and via fabrication center connector websocket (145), data communication with fabrication center application (125) running on a second computing device (e.g., 126). Method (300) may include the step of receiving (310), by the fabrication center application and from the fabrication tools application, and via the fabrication center connector websocket (145), data representative of a 3D model of a to-be-fabricated part or assembly modeled in the 3D modeling application (105). Method (300) may include the step of generating (311), by the fabrication center application, and based at least in part on the data representative of the 3D model of the to-befabricated part or assembly, data representative of at least one enhanced cut (or bend) list usable by a machine control application for the one or more fabrication machines (e.g., cutting, bending, etc. machines) to fabricate the to-be-fabricated part or assembly. Method (300) may include the step of establishing (315), by the fabrication center application, and via the fabrication center connector websocket (145), data communication with a fabrication desktop application (160) associated with the machine control application running on at least a third computing device (150) and configured to control operation of the one or more fabrication machines. Method (300) may include the step of transmitting (320), by the fabrication center application, and via the fabrication center connector websocket (145), the data representative of the at least one enhanced cut (or bend or threading) list to the at least a third computing device to enable use by the machine control application of the at least one enhanced cut (or bend or threading) list for fabrication of the to-be-fabricated part or assembly by the one or more fabrication machines (110).

Figure 18:
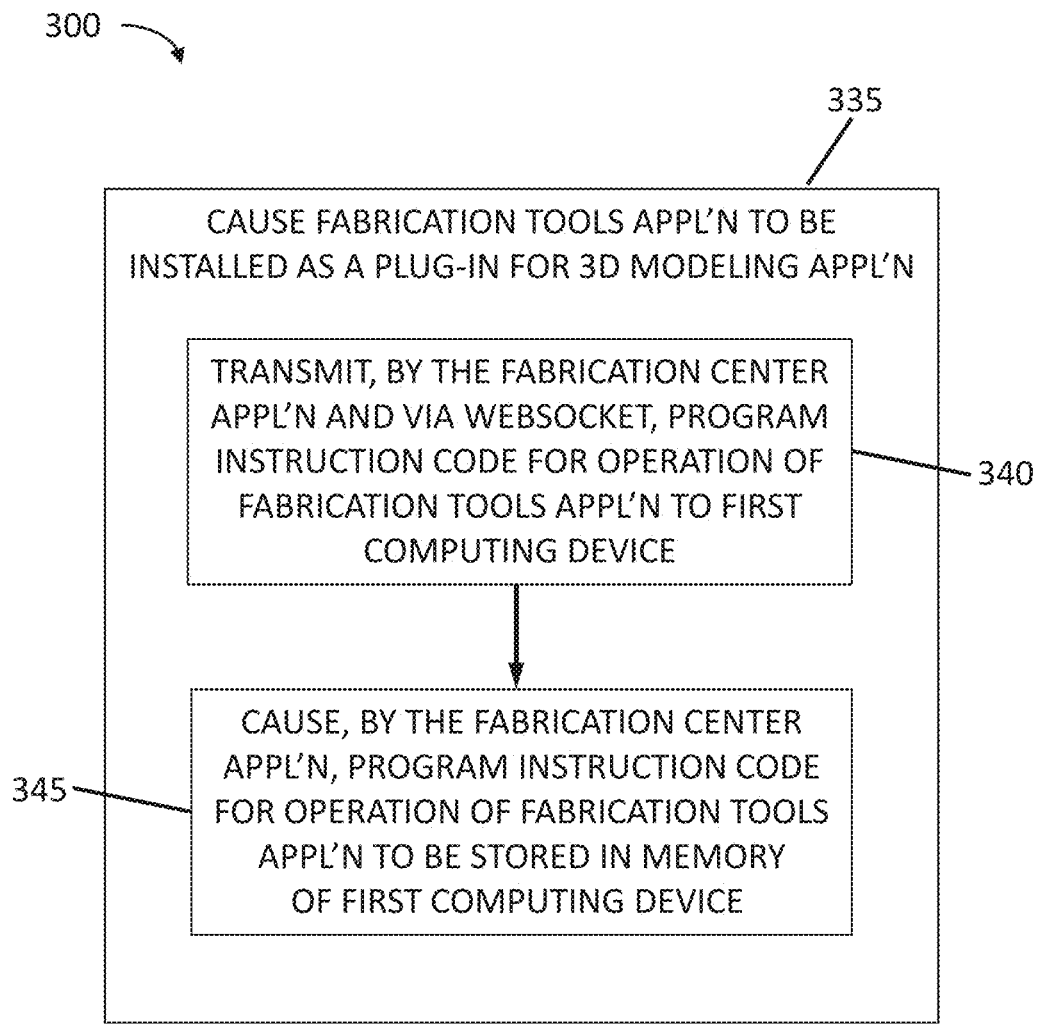

Referring now to FIG. 18, in some embodiments, method (300) may also include the step of causing (335), by the fabrication center application, the fabrication tools application to be installed as a plug-in for the 3D modeling application. In an example, the step of causing (335) the fabrication tools application to be installed may include transmitting (340), by the fabrication center application, and via the fabrication center connector websocket, data representative of at least a portion of program instruction code for operation of the fabrication tools application to the first computing device. In some embodiments, method (300) may further include the step of causing (345), at least in part by the fabrication center application, the data representative of at least a portion of program instruction code for operation of the fabrication tools application to be stored in a memory storage device of the first computing device and accessible by at least one of: the fabrication tools application, and the fabrication center application.

In some embodiments, method (300) may also include the step of causing, by the fabrication center application, an application for operation in the method of the fabrication center connector websocket to be installed on the first, and the at least a third, computing devices. In an example, the step of causing the application for operation in the method of the fabrication center connector websocket to be installed may include transmitting, by the fabrication center application, data representative of at least a portion of program instruction code for operation of the application for operation in the method of the fabrication center connector websocket to the first, and the at least a third, computing devices. In some embodiments, method (300) may further include the step of causing, at least in part by the fabrication center application, data representative of at least a portion of program instruction code for operation of the application for operation in the method of the fabrication center connector websocket to be stored in memory storage devices of the first, and the at least a third, computing devices and accessible by the fabrication tools application, and the fabrication desktop application, respectively.

Figure 19:
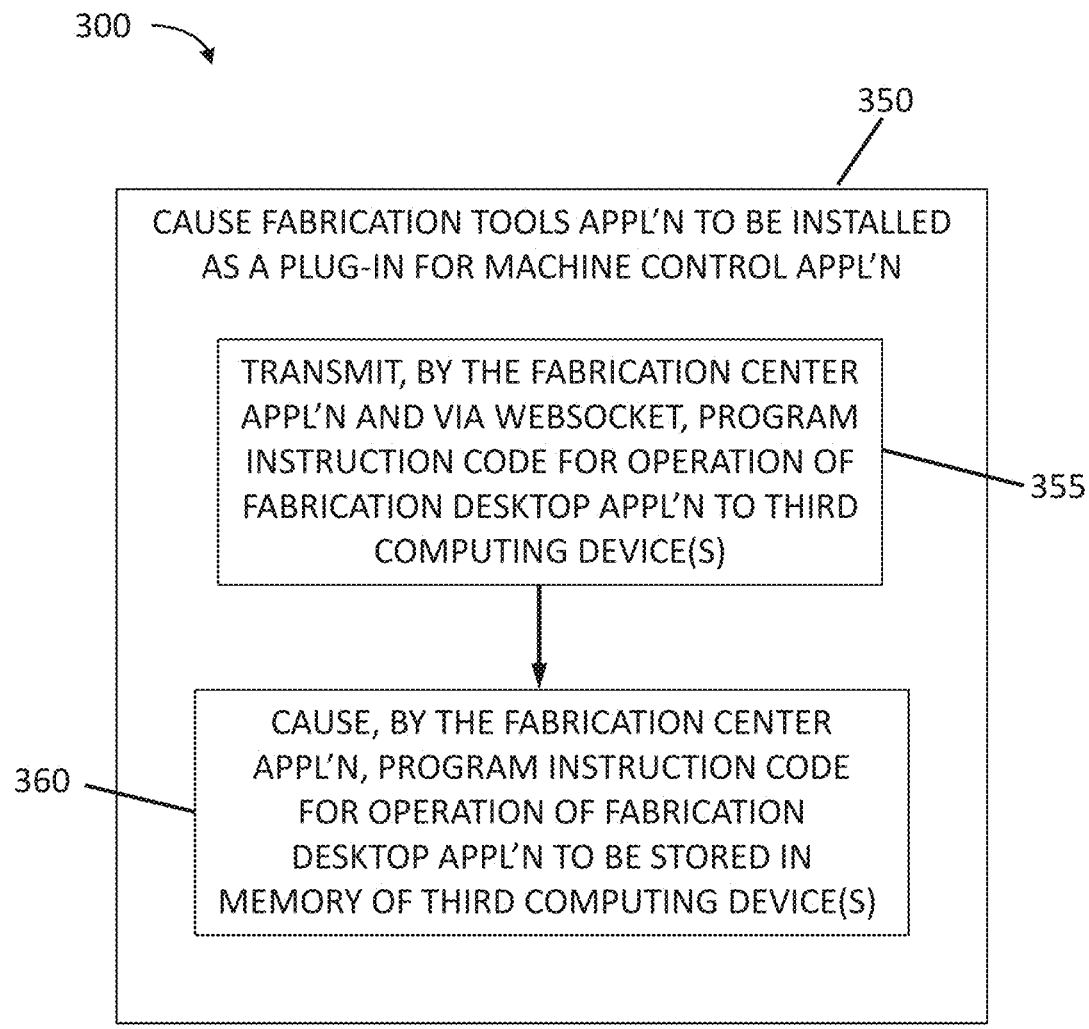

Referring now to FIG. 19, in some embodiments, the method (300) may also include the step of causing (350), by the fabrication center application, the fabrication desktop application to be installed as a plug-in for the machine control application. In some embodiments, causing (350) the fabrication desktop application to be installed comprises transmitting (355), by the fabrication center application, and via the fabrication center connector websocket, data representative of at least a portion of program instruction code for operation of the fabrication desktop application to the at least a third computing device. In an example, the method (300) may further include the step of causing (360), at least in part by the fabrication center application, the data representative of at least a portion of program instruction code for operation of the fabrication desktop application to be stored in a memory storage device of the at least a third computing device accessible by at least one of: the fabrication desktop application, and the fabrication center application.

Figure 20:
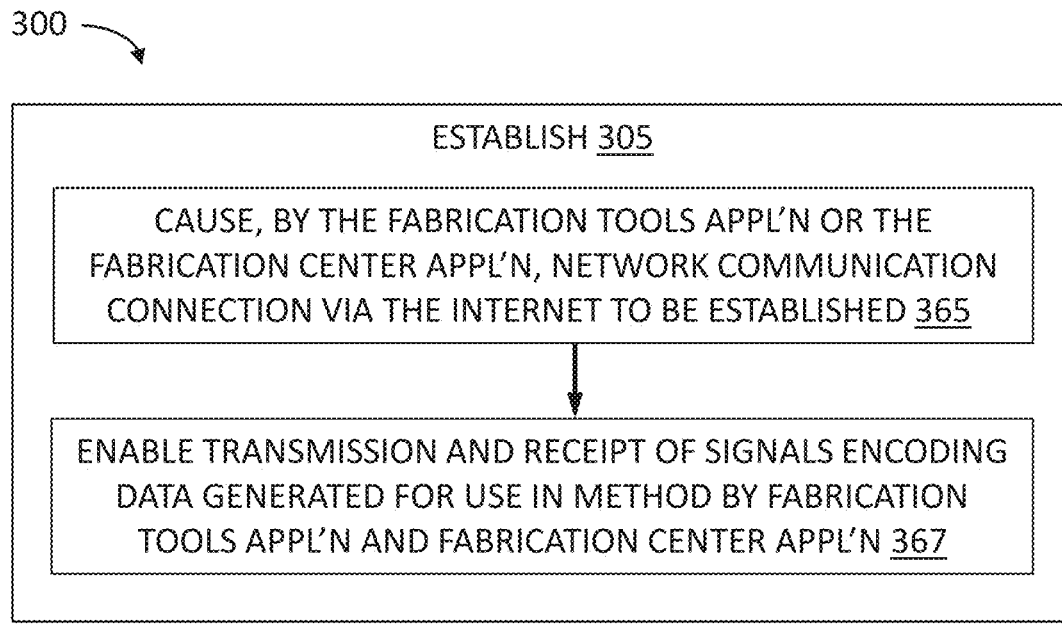

Referring now to FIG. 20, in some embodiments, the method (300) step of establishing (305) data communication with the fabrication center application via the fabrication center connector websocket (145) may include causing (365), at least in part by the fabrication tools application or the fabrication center application, a network (120) communication connection between respective communication interfaces of the first and second computing devices to be established further via the Internet to enable (367) transmission and receipt of signals encoding data generated for use in the method (100) by the fabrication tools application and the fabrication center application. In an example, the method (300) may also include the step of enabling (367) the aforementioned transmission and receipt of signals encoding data generated for use in the method (100) by the fabrication tools application and the fabrication center application.

Figure 21:
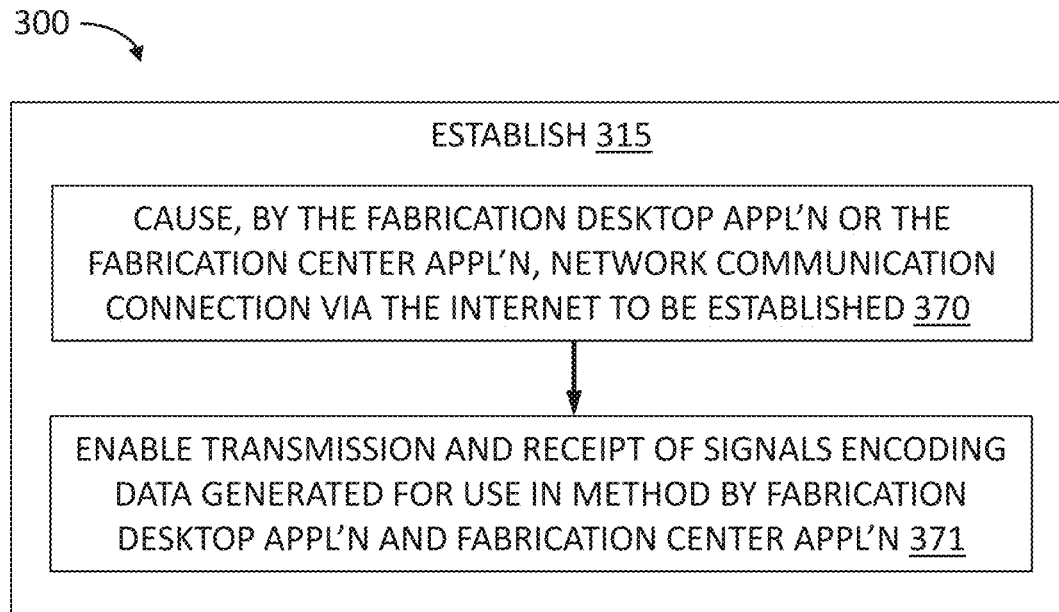

Referring now to FIG. 21, in some embodiments, the method (300) step of establishing (315) data communication with the fabrication desktop application via the fabrication center connector websocket (145) may include causing (370), at least in part by the fabrication desktop application or the fabrication center application, a network communication connection between respective communication interfaces of the second and the at least a third computing devices to be established further via the Internet to enable (371) transmission and receipt of signals encoding data generated for use in the method (100) by the fabrication desktop application or the fabrication center application. In an example, the method (300) may also include the step of enabling (371) the aforementioned transmission and receipt of signals encoding data generated for use in the method (100) by the fabrication desktop application or the fabrication center application.

Figure 22:
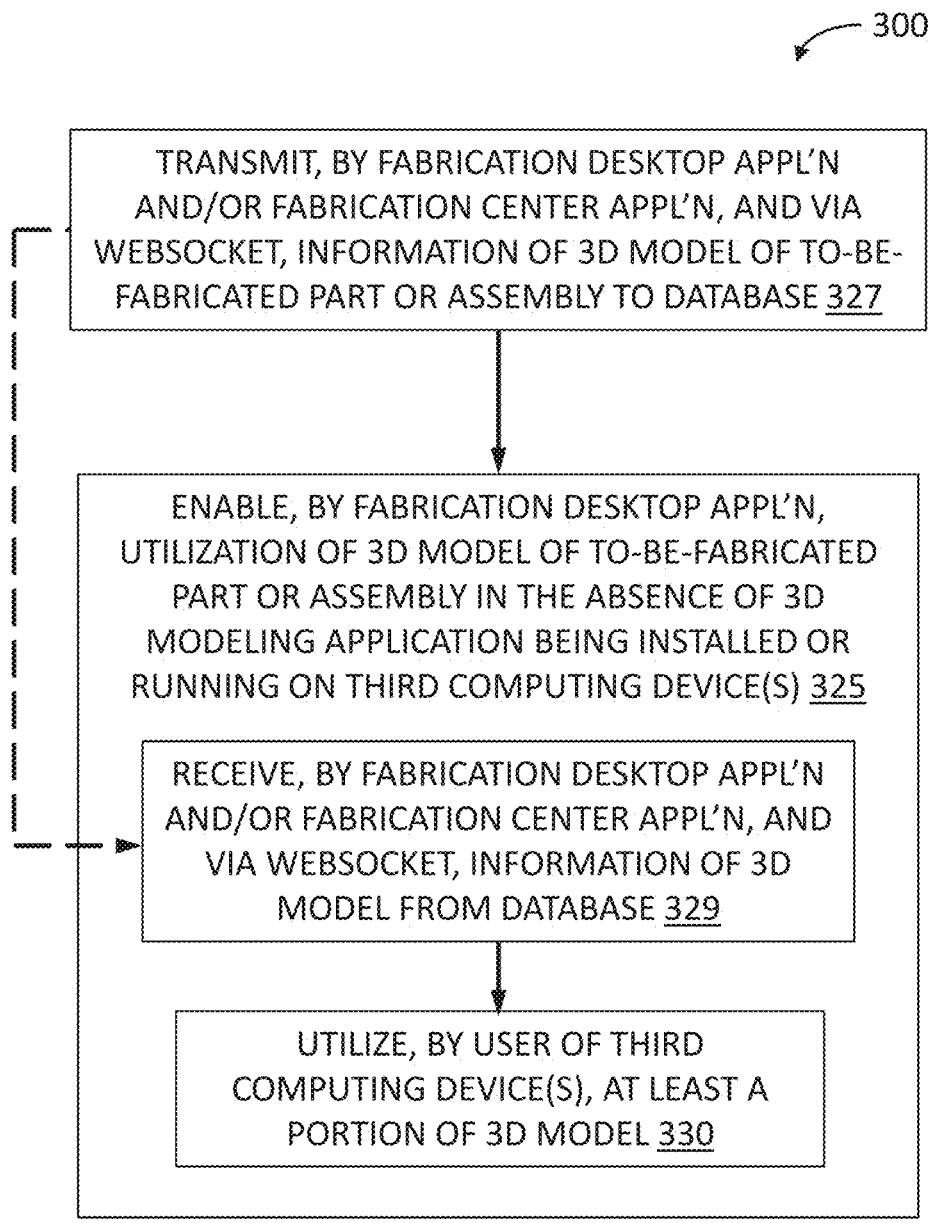

Referring now to FIG. 22, in some embodiments, the method (300) may also include the step of enabling (325), at least in part by the fabrication desktop application, utilizing (330), e.g., by a user of the at least a third computing device, features of at least a portion of the 3D model of the to-be-fabricated part or assembly in the absence of the 3D modeling application being installed or running on the at least a third computing device. In an example, the method (300) may include the step of transmitting (327), by at least one of the fabrication tools application and the fabrication center application, and via the fabrication application center connector websocket (145), at least some of the information of the 3D model of the to-be-fabricated part or assembly to at least one database (e.g., 140 and/or 141). In some embodiments, the enabling (325) step of method (100) may include receiving (329), by at least one of the fabrication desktop application and the fabrication center application, and via the fabrication application center connector websocket, the at least some of the information of the 3D model from the database (140) to facilitate the utilizing (330) by the user or other stakeholder of system (100). In an example, the aforementioned "at least some of the information of the 3D model" may include the state (165) of the 3D model.

Figure 23:
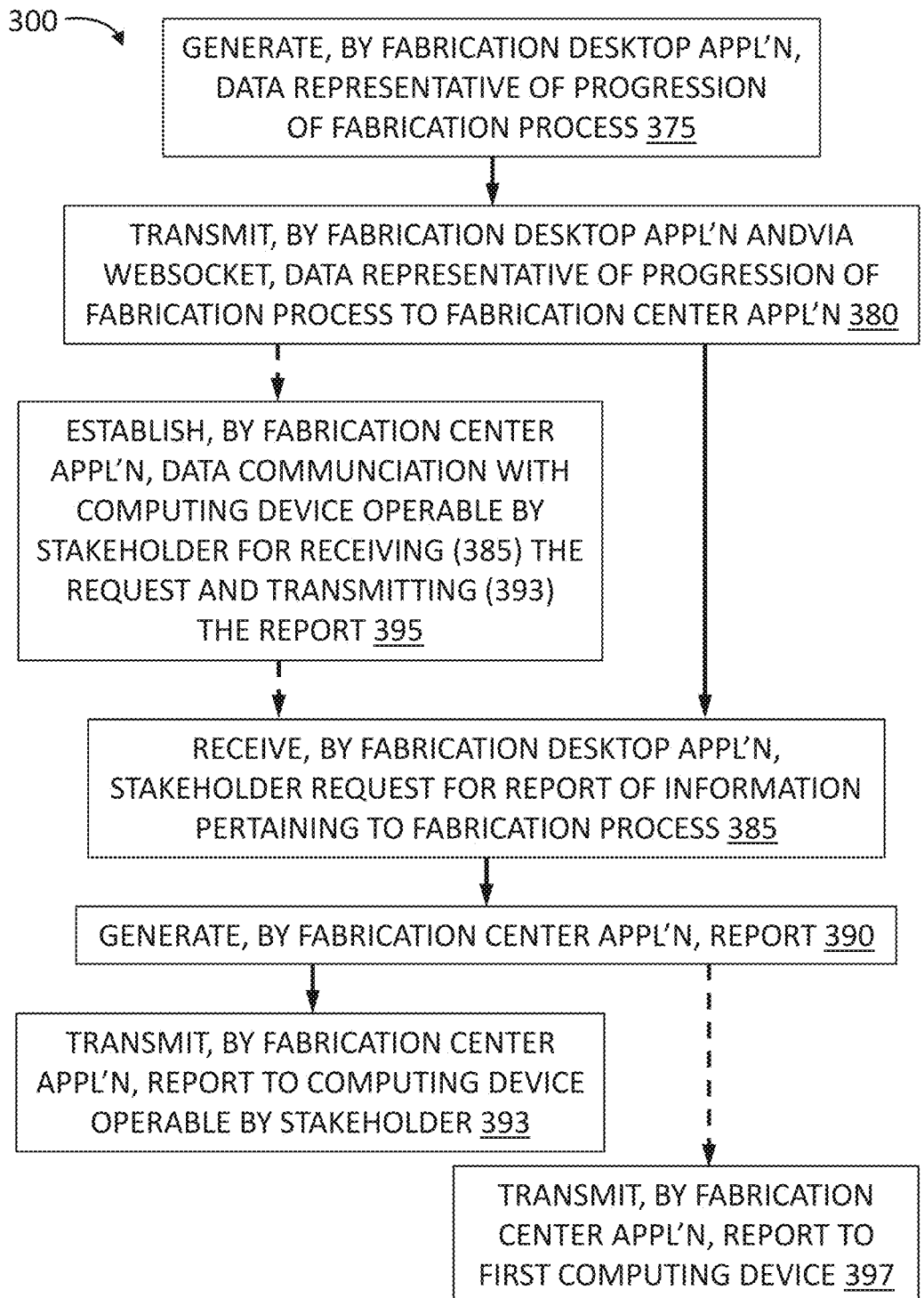

Referring now to FIG. 23, in some embodiments, method (300) may also include the step of generating (375), by the fabrication desktop application, data representative of a progression of a fabrication process involving the one or more fabrication machines and the to-be-fabricated part or assembly. In an example, the method (300) step of generating (375) the data representative of the progression of the fabrication process may include generating data representative of the progression of the fabrication process including at least one of: a start time of the process, an estimated completion time of the process, an identifier of a fabrication machine involved in the process, an identifier of the part or assembly, an identifier of an order or invoice of the process, an identifier of a customer to receive the part or assembly upon completion of the process, an identifier of an originator of an order for the process, an identifier of a fabrication shop carrying out the process, a number of cuts or bends performed by a particular fabrication machine utilizing, at least in part, aspects of system (100), and an indication of an availability of the one or more fabrication machines for the process or for a different fabrication process involving another part or assembly.

Still referring to FIG. 23, in some embodiments, method (300) may further include the step of transmitting (380), at least in part by the fabrication desktop application, and via the fabrication center connector websocket, the data representative of a progression of a fabrication process to the fabrication center application for use thereby. In the embodiment shown in FIG. 23, method (300) also includes the step of receiving (385), by the fabrication desktop application, a signal encoding data representative of a request of a fabrication process stakeholder for a report of information pertaining to the fabrication process. In an example, in response to receiving (385) the request, the following steps may be performed in the method (300): generating (390), by the fabrication center application, the report; and transmitting (393), at least in part by the fabrication center application, the report to a computing device (e.g., at least one of 130, 150, or other(s) utilizing websocket (145) according to the present technology) operable by the stakeholder (129) for viewing thereby. The aforementioned computing device operable by the stakeholder (129) may be positioned remotely with respect to at least one of: the first computing device, the second computing device, and the at least a third computing device. In an example, the aforementioned computing device operable by the stakeholder (129) may be the same computing device as, or is a computing device positioned proximate to, at least one of: the first computing device, the second computing device, and the at least a third computing device.

Referring still to FIG. 23, in some embodiments, the method (300) may further include the step of establishing (395), at least in part by the fabrication center application, data communication with the aforementioned computing device (129) operable by the stakeholder for receiving (385) the request and transmitting (393) the report. In an example, the method (300) step of establishing (395) data communication with the computing device (129) operable by the stakeholder may include causing, at least in part by the fabrication center application, a network communication connection between respective communication interfaces of the second computing device and the computing device (129) operable by the stakeholder to be established via the fabrication center connector websocket to enable transmission and receipt of signals encoding data generated for use in the method (300) by at least one of: a stakeholder application (131) running on the computing device operable by the stakeholder (129), the fabrication desktop application, and the fabrication center application. Computing device (129) may utilize websocket (145) to communicate bi-directionally with other computing devices (e.g., 130, 126 and/or 150) in system (100), including, for example and without limitation, for purpose of the method (100) according to the present technology. In an example, the establishing (395) step may be performed in method (300) after, or concurrently with, the transmitting (375) and before, or concurrently with, the receiving (385) step. In some embodiments, method (300) may also include the step of transmitting (397), at least in part by the fabrication center application, the report to the first computing device for viewing by a user thereof. In an example the transmitting (397) step may be performed in method (300) after, or concurrently with, the generating (390) step.

Figure 24:
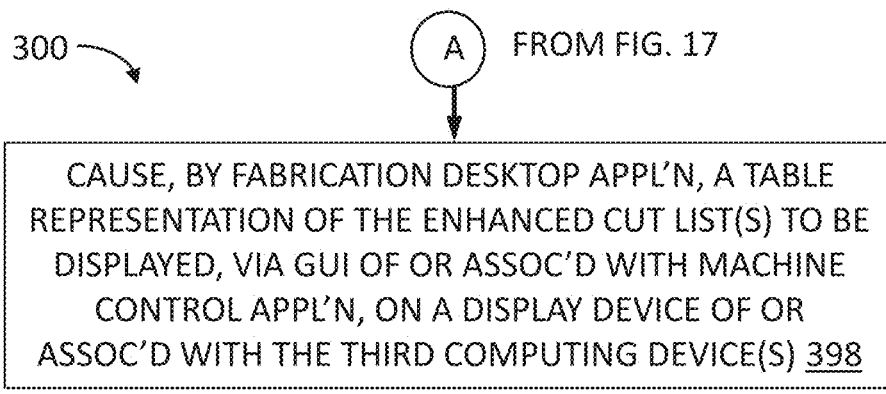

Referring now to FIG. 24, in some embodiments, the method (300) may further include the step of causing (398), at least in part by the fabrication desktop application, a table representation of the at least one enhanced cut (or bend or threading) list to be displayed, via a graphical user interface of or associated with the machine control application, on an electronic display device of or associated with the at least a third computing device. Examples of this aspect according to the present technology are described above with reference to foregoing figures other than FIGS. 17-28.

Figure 25:
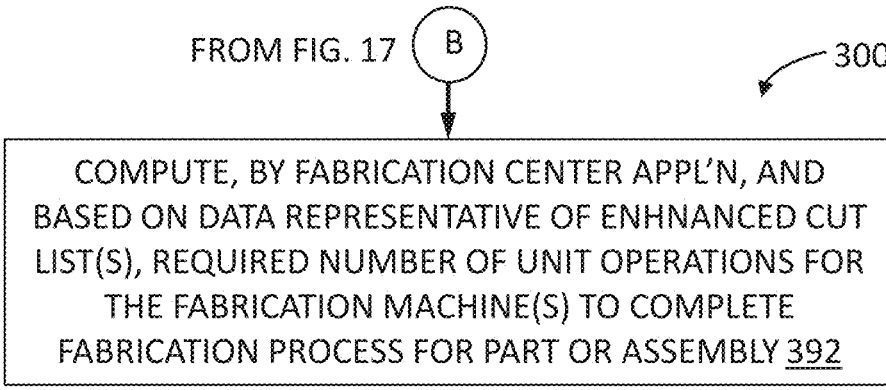

Referring now to FIG. 25, in some embodiments, the method (300) may also include the step of computing (392), by the fabrication center application, and based at least in part on the data representative of the at least one enhanced cut (or bend or threading) list, a required number of unit operations (e.g., cuts, bends, threading) for the one or more fabrication machines to complete a fabrication process involving the to-be-fabricated part or assembly. These data may facilitate billing and invoicing calculations being performed by fabrication center (125) following completion of a fabrication processing using the aforementioned unit operations, as in a productivity-based billing model.

Figure 26:
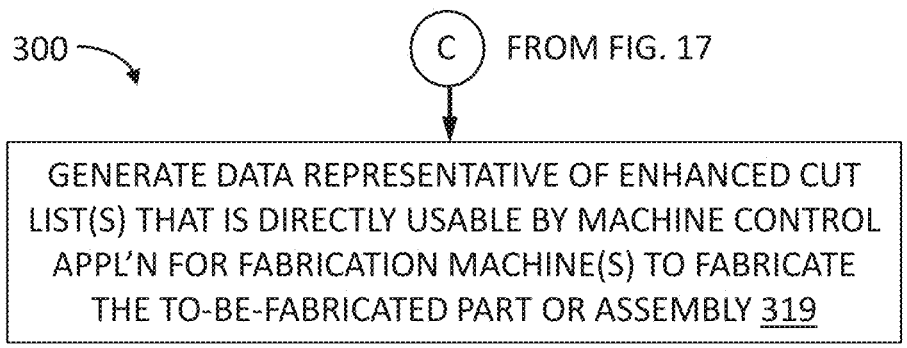

Referring now to FIG. 26, in some embodiments, the method (300) step of generating (311) the data representative of the at least one enhanced cut (or bend or threading) list may include generating (319) data representative of the at least one enhanced cut (or bend or threading) list that is directly usable by the machine control application for the one or more fabrication machines to fabricate the to-be-fabricated part or assembly. Directly usable, as used herein, may mean that at least some of the manual (e.g., at least in part requiring a human being to perform) steps required in conventional fabrication processes using fabrications machines (e.g., 10 as shown in FIG. 1), are no longer required when practicing the present technology. In some examples according to the present technology, all or most of such manual process steps may be eliminated, as for example, in operations involving the present technology that may occur in outer space or in other environments unsuitable or impractical for humans to be present.

Figure 27:
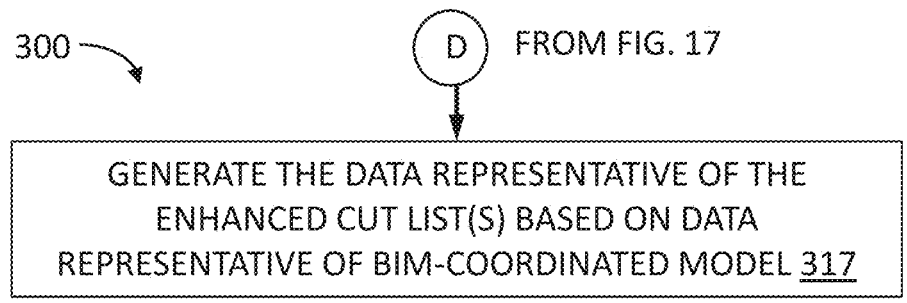

Referring now to FIG. 27, in an example according to the present technology, the 3D model of the to-be-fabricated part or assembly may be a building information model (BIM)-coordinated 3D model. In these examples, the generating (311) step of the method (300) according to some embodiments may include generating (317) the data representative of the at least one enhanced cut (or bend or threading) list based on data representative of the BIM-coordinated 3D model.

Figure 28:
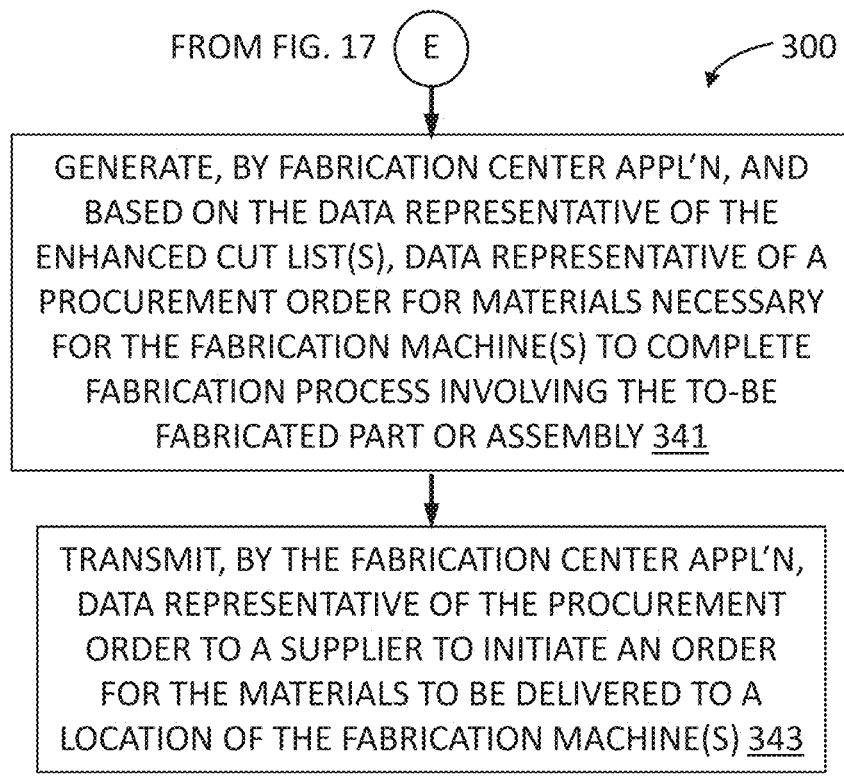

Referring now to FIG. 28, in some embodiments, method (300) may further include the steps of: generating (341), at least in part by the fabrication center application, and based at least in part on the data representative of the at least one enhanced cut (or bend or threading) list, data representative of a procurement order for materials necessary for the one or more fabrication machines to complete a fabrication process involving the to-be-fabricated part or assembly; transmitting (343), at least in part by the fabrication center application, data representative of the procurement order to a supplier to initiate an order for the materials to be delivered to a location (155) of the one or more fabrication machines (e.g., fabrication shop(s) (155)).

In some embodiments of the system (100) and/or method (300) according to the present technology, the second computing device (e.g., 126 as server) is positioned remotely with respect to the first computing device (e.g., PC 130). In some embodiments of the system (100) and/or method (300) according to the present technology, the at least a third computing device (e.g., workstation(s) 150)) may be positioned remotely with respect to the second computing device (e.g., 126). In an example, the at least a third computing device (e.g., 150) may be further positioned remotely with respect to the first computing device (e.g., 130). As may be used in the system (100) and/or method (300) according to the various embodiments disclosed herein according to the present technology, the one or more fabrication machines may include a cutting, bending or threading machine (110). Also, as may be physically acted upon (or otherwise used, e.g., in a many that advantageous changes a physical state or dimension of a physical object existing, and used for beneficial practical ends in the real world), the aforementioned "to-be-fabricated part or assembly" may be, or may include, a beam, a sheet, a plank, a block, a pipe, a rod, a wire, a cable, a tube or a conduit piece.

Any of the steps and/or associated processes of method (300) according to the present technology, including as described above, for example and without limitation, for various embodiments described above and with reference to FIG. 17-28, may be performed, executed, or otherwise facilitated, at least in part by computing device(s) (e.g., 130, 126 and/or 150), where each of those computing devices may include one or more processors, or like digital and/or analog devices having equivalent functionality. In those cases, the one or more processor(s) may be said to be configured to perform a functional equivalent of one or more of the above described steps or processes of method (300) according to the present technology. The processor(s) of the computing device(s) (e.g., 130, 126 and/or 150) of system (100) may be operably coupled to one or more memory storage devices, which may be collocated (e.g., in a housing of the computer or server) or may additionally, or instead, be operably coupled to the processor(s) by way of data communication lines or wireless signals (e.g., by way of network (120) using the Internet). The memory storage device(s) may include one non-transitory computer readable media. The one or more non-transitory computer readable media may have program instructions (e.g., executable software and/or firmware code) that, when executed by the processor(s) of system (100) or any of its computing device(s), may cause the system (100) (and likewise any of its computing devices), to perform, execute, or otherwise facilitate any of the steps and/or associated processes of method (300) according to the present technology, including as described above, for example and without limitation, for various embodiments described with reference to FIGS. 17-28.

Figure 29:
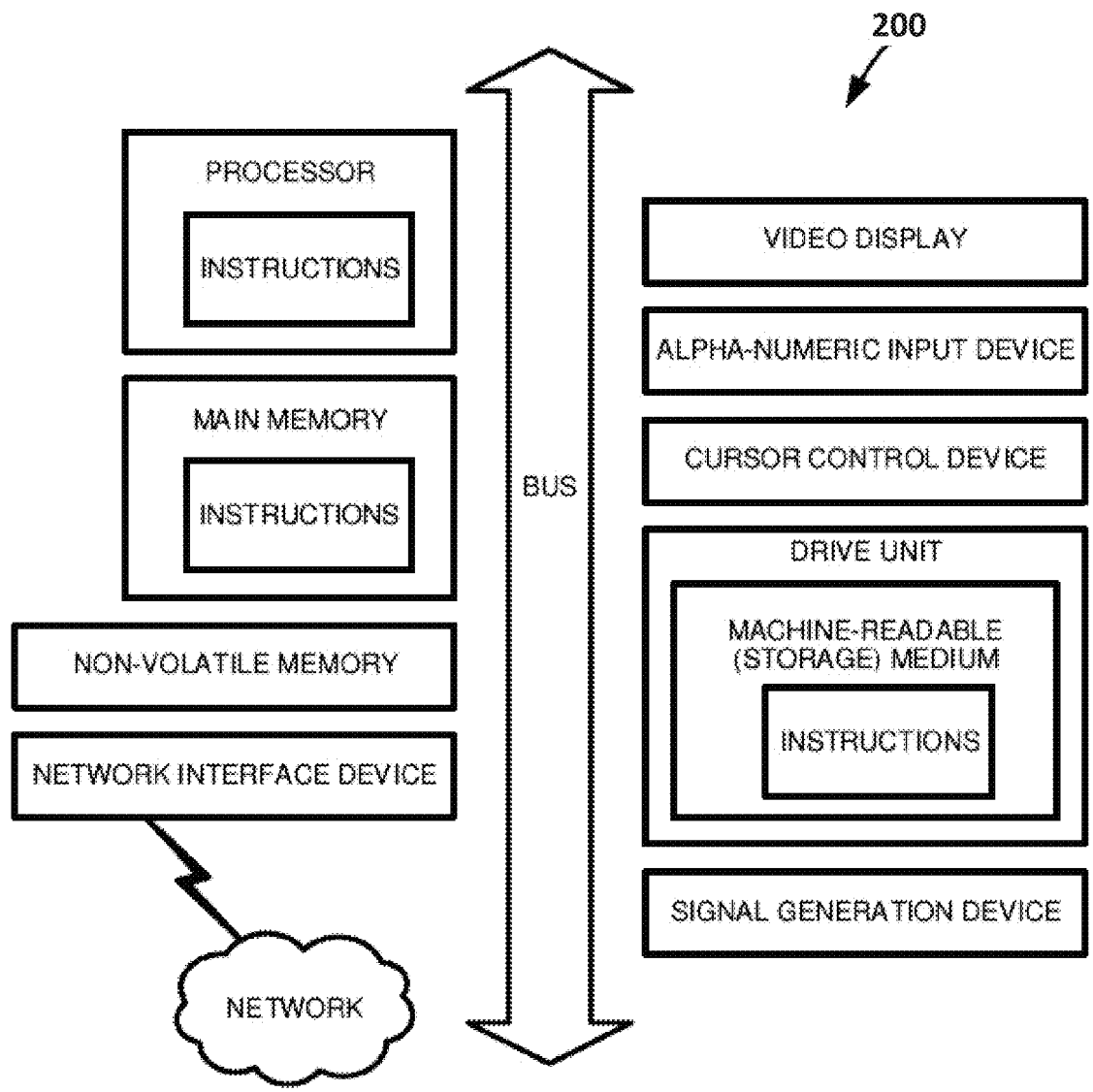
FIG. 29 is a diagrammatic representation of a machine, in the example form, of a computer system within which a set of instructions, for causing the machine to implement or otherwise perform any one or more of the techniques and methodologies of the present technology described herein, may be executed.

FIG. 29 is a diagrammatic representation of a machine, in the example form, of a computer system (200) within which a set of instructions, for causing the machine to implement or otherwise perform any one or more of the techniques and methodologies of the present technology described herein, may be executed. Computer system (200) may, for some embodiments of the present technology, be representative of controller means including, without limitation, a processor, a computer, a server, and like computing devices which may include associated memory storage devices.

In the example of FIG. 29, the computer system (200) includes a processor, memory, non-volatile memory, and an interface device. Various common components (e.g., cache and/or register memory) are omitted for illustrative simplicity. The computer system (200) is intended to illustrate at least one hardware device on which any of the components depicted in the example of FIG. 2 (and any other components described in this specification) can be implemented. The computer system (200) can be of any applicable known or convenient type. The components of the computer system 700 can be coupled together via a bus or through some other known or convenient device.

The processor of computer system (200) may be, for example, a conventional microprocessor such as an INTEL PENTIUM microprocessor or MOTOROLA POWER PC microprocessor. One of skill in the relevant art will recognize that the terms "machine-readable (storage) medium" or "computer-readable (storage) medium" include any type of device that is accessible by the processor. In some embodiment, these storage media are embodied in non-transitory computer-readable media that can store program instructions (e.g., as software or firmware) which, when executed by one or more processors of the disclosed technology, cause the controller means (computing system) to implement, execute, or otherwise facilitate performance of the various algorithms and methods disclosed herein.

In computer system (200), the memory is coupled to the processor by, for example, a bus. The memory can include, by way of example but not limitation, random access memory (RAM), such as dynamic RAM (DRAM) and static RAM (SRAM). The memory can be local, remote, or distributed.

The bus of computer system (200) also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer system (200). The non-volatile storage can be local, remote, or distributed. The non-volatile memory is optional because systems can be created with all applicable data available in memory. An embodiment of computer system (200) will usually include at least a processor, memory, and a device (e.g., a bus) coupling the memory to the processor.

Software or firmware utilized by computer system (200) may be stored in the non-volatile memory and/or the drive unit. Indeed, for large programs, it may not even be possible to store the entire program in the memory. Nevertheless, it should be understood that for software and/or firmware to run, if necessary, it is moved to a computer readable location appropriate for processing, and for illustrative purposes, that location is referred to as the memory in this disclosure. Even when software is moved to the memory for execution, the processor will typically make use of hardware registers to store values associated with the software, and local cache that, ideally, serves to speed up execution. As used herein, firmware or a software program is assumed to be stored at any known or convenient location (from non-volatile storage to hardware registers) when the software program is referred to as "implemented in a computer-readable medium". A processor is considered to be "configured to execute a program" when at least one value associated with the program is stored in a register readable by the processor.

The bus also couples the processor to the network interface device of computer system (200). The interface can include one or more of a modem or a network interface. It will be appreciated that a modem or network interface can be considered to be part of the computer system. The interface can include an analog modem, ISDN modem, cable modem, token ring interface, satellite transmission interface (e.g., "direct PC"), or other interfaces for coupling a computer system (e.g., 200) to other computer systems. The interface can include one or more input and/or output (I/O) devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 29 reside in the interface.

In operation, the computer system (200) can be controlled by operating system software that includes a file management system, such as a disk operating system. One example of operating system software with associated file management system software is the family of operating systems known as WINDOWS from MICROSOFT Corporation of Redmond, Washington, and their associated file management systems. Another example of operating system software with its associated file management system software is the LINUX operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

Some portions of the detailed description may be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general-purpose systems may be used with programs in accordance with the teachings herein, or it may prove convenient to construct more specialized apparatus to perform the methods of some embodiments. The required structure for a variety of these systems will appear from the description herein. In addition, the techniques are not described with reference to any particular programming language, and various embodiments may thus be implemented using a variety of programming languages.

In alternative embodiments, the machine operates as a standalone device or may be connected (e.g., networked) to other machines. In a networked deployment, the machine may operate in the capacity of a server or a client machine in a client-server network environment or as a peer machine in a peer-to-peer (or distributed) network environment.

The machine may be a server computer, a client computer, a personal computer (PC), a tablet PC, a laptop computer, a set-top box (STB), a personal digital assistant (PDA), a cellular telephone, an IPHONE, a BLACKBERRY, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation. This may also be referred to herein as applied to the present technology as "one or more non-transitory computer-readable media."

In general, the routines executed to implement the embodiments of the disclosure may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a software program product in a variety of forms, and that the disclosure applies equally regardless of the particular type of machine or computer-readable media used to actually effect the distribution. In the context of the present technology, this may also be referred to as a "computer program product."

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above detailed description using the singular or plural number may also include the plural or singular number, respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are, at times, shown as being performed in a series, these processes or blocks may instead be performed in parallel, or may be performed at different times. Further, any specific numbers noted herein are only examples: alternative implementations may employ differing values or ranges.

The teachings of the disclosure provided herein can be applied to other systems, not necessarily the system described above. For instance, the present technology may be beneficially applied by persons having ordinary skill in the art in applications other than the specifically described example embodiments where utilizing information of 3D modeling software to facilitate downstream operations including, but not necessarily limited to, using machine for fabrication of parts and assemblies, with enhanced efficiency, speed, safety and effectiveness may be advantageous for users and other stakeholders. Likewise, the elements and acts of the various embodiments described above can be combined to provide further embodiments.

Any patents or patent applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above detailed description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above detailed description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. § 112(f), other aspects may likewise be embodied as a means-plus-function claim, or in other forms, such as being embodied in a computer-readable medium. (Any claims intended to be treated under 35 U.S.C. § 112(f) will begin with the words "means for".) Accordingly, the applicant reserves the right to add additional claims after filing the application to pursue such additional claim forms for other aspects of the disclosure.

The detailed description provided herein may be applied to other systems, not necessarily only the system described above. The elements and acts of the various examples described above can be combined to provide further implementations of the invention. Some alternative implementations of the invention may include not only additional elements to those implementations noted above, but also may include fewer elements. These and other changes can be made to the invention in light of the above detailed description. While the above description defines certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above detailed description section explicitly defines such terms. Accordingly, the actual scope of the invention encompasses not only the disclosed examples, but also all equivalent ways of practicing or implementing the invention.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments can be made, and other embodiments not specifically described herein will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A system comprising:
   at least one processor;
   a communications interface operably coupled to the at least one processor; and
   a fabrication center application including program instructions which, when executed by the at least one processor to facilitate operation of one or more fabrication machines using digitally stored part or assembly information of a three-dimensional (3D) modeling application, cause the system to:
      generate, based at least in part on data representative of a 3D model of a to-be-fabricated part or assembly received using the communications interface via a fabrication center connector websocket from a fabrication tools application associated with the 3D modeling application, data representative of at least one enhanced cut, bend, or threading list; and
      transmit, using the communications interface and via the fabrication center connector websocket, the data representative of the at least one enhanced cut, bend, or threading list to at least one computing device running a fabrication desktop application associated with a machine control application to enable use thereby of the at least one enhanced cut, bend, or threading list for fabrication of the to-be-fabricated part or assembly using the one or more fabrication machines.

2. The system of claim 1, wherein, when executed by the at least one processor, the program instructions further cause the system to:
   generate, based at least in part on the data representative of the at least one enhanced cut, bend, or threading list, data representative of a procurement order for materials necessary for the one or more fabrication machines to complete a fabrication process involving the to-be-fabricated part or assembly; and
   transmit, using the communications interface, the data representative of the procurement order to a supplier to initiate an order for the materials to be delivered to at least one fabrication shop having the one or more fabrication machines.

3. The system of claim 1 further comprising the fabrication desktop application including program instructions which, when executed by one or more processors of the at least one computing device running the fabrication desktop application, cause the system to:
   generate data representative of a progression of a fabrication process involving the one or more fabrication machines and the to-be-fabricated part or assembly; and
   transmit, using a communications interface of the at least one computing device and via the fabrication center connector websocket, the data representative of the progression of the fabrication process to the fabrication center application for use by a process stakeholder.

4. The system of claim 1, wherein, when executed by the at least one processor, the program instructions further cause the system to:
   generate a report of information pertaining to a fabrication process involving the one or more fabrication machines and the to-be-fabricated part or assembly; and
   transmit, using the communications interface and via the fabrication center connector websocket, the report to a workstation including at least one of:
   the at least one computing device running the fabrication desktop application;
   another computing device operable by a process stakeholder; and
   yet another computing device running the fabrication tools application.

5. A method implemented at least in part by a fabrication center application under control of at least one processor to facilitate operation of one or more fabrication machines using digitally stored part or assembly information of a three-dimensional (3D) modeling application, the method comprising:
   generating, based at least in part on data representative of a 3D model of a to-be-fabricated part or assembly received using a communications interface via a fabrication center connector websocket from a fabrication tools application associated with the 3D modeling application, data representative of at least one enhanced cut, bend, or threading list; and
   transmitting, using the communications interface and via the fabrication center connector websocket, the data representative of the at least one enhanced cut, bend, or threading list to at least one computing device running a fabrication desktop application associated with a machine control application to enable use thereby of the at least one enhanced cut, bend or threading list for fabrication of the to-be-fabricated part or assembly using the one or more fabrication machines.

6. The method of claim 5 further comprising enabling, via the fabrication center connector websocket, remote access to the at least one enhanced cut, bend, or threading list to facilitate procurement and processing of materials for a fabrication process involving the to-be-fabricated part or assembly.

7. The method of claim 5 further comprising generating, based at least in part on the data representative of the at least one enhanced cut, bend, or threading list, data representative of a procurement order for materials necessary for the one or more fabrication machines to complete a fabrication process involving the to-be-fabricated part or assembly.

8. The method of claim 7 further comprising transmitting, using the communications interface, the data representative of the procurement order to a supplier to initiate an order for the materials to be delivered to at least one fabrication shop having the one or more fabrication machines.

9. The method of claim 5 further implemented in the fabrication desktop application under control of one or more processors of the at least one computing device running the fabrication desktop application, the method further comprising generating data representative of a progression of a fabrication process involving the one or more fabrication machines and the to-be-fabricated part or assembly.

10. The method of claim 9 further comprising transmitting, using a communications interface of the at least one computing device and via the fabrication center connector websocket, the data representative of the progression of the fabrication process from the at least one computing device running the fabrication desktop application to the fabrication center application for use by a process stakeholder.

11. The method of claim 5 further comprising:
generating a report of information pertaining to a fabrication process involving the one or more fabrication machines and the to-be-fabricated part or assembly; and
transmitting, using the communications interface and via the fabrication center connector websocket, the report to a workstation including at least one of:
the at least one computing device running the fabrication desktop application;
another computing device operable by a process stakeholder; and
yet another computing device running the fabrication tools application.

12. The method of claim 5, wherein the at least one computing device includes a plurality of workstations each running the fabrication desktop application, the method further comprising distributing, using the communications interface and via the fabrication center connector websocket, fabrication work orders involving the at least one enhanced cut, bend, or threading list to at least some of the plurality of workstations.

13. The method of claim 12 further comprising syncing, via the fabrication center connector websocket, the at least one enhanced cut, bend, or threading list to ensure that the at least some of the plurality of workstations have the most current information to work from.

14. One or more non-transitory computer readable media having stored thereon program instructions which, when executed by at least one processor to facilitate operation of one or more fabrication machines using digitally stored part or assembly information of a three-dimensional (3D) modeling application, cause a machine to:
generate, based at least in part on data representative of a 3D model of a to-be-fabricated part or assembly received using a communications interface via a fabrication center connector websocket from a fabrication tools application associated with the 3D modeling application, data representative of at least one enhanced cut, bend, or threading list; and
transmit, using the communications interface and via the fabrication center connector websocket, the data representative of the at least one enhanced cut, bend, or threading list to at least one computing device running a fabrication desktop application associated with a machine control application to enable use thereby of the at least one enhanced cut, bend, or threading list for fabrication of the to-be-fabricated part or assembly using the one or more fabrication machines.

15. The one or more non-transitory computer readable media of claim 14, wherein, when executed by the at least one processor, the program instructions further cause the machine to:
generate, based at least in part on the data representative of the at least one enhanced cut, bend, or threading list, data representative of a procurement order for materials necessary for the one or more fabrication machines to complete a fabrication process involving the to-be-fabricated part or assembly; and
transmit, using the communications interface, the data representative of the procurement order to a supplier to initiate an order for the materials to be delivered to at least one fabrication shop having the one or more fabrication machines.

16. The one or more non-transitory computer readable media of claim 14, wherein, when executed by the at least one processor, the program instructions further cause the machine to generate a report of information pertaining to a fabrication process involving the one or more fabrication machines and the to-be-fabricated part or assembly.

17. The one or more non-transitory computer readable media of claim 16, wherein, when executed by the at least one processor, the program instructions further cause the machine to transmit, using the communications interface and via the fabrication center connector websocket, the report to a workstation including at least one of:
the at least one computing device running the fabrication desktop application;
another computing device operable by a process stakeholder; and
yet another computing device running the fabrication tools application.

18. The one or more non-transitory computer readable media of claim 14, wherein the at least one computing device includes a plurality of workstations each running the fabrication desktop application, and wherein, when executed by the at least one processor, the program instructions further cause the machine to distribute, using the communications interface and via the fabrication center connector websocket, fabrication work orders involving the at least one enhanced cut, bend, or threading list to at least some of the plurality of workstations.

19. The one or more non-transitory computer readable media of claim 18, wherein, when executed by the at least one processor, the program instructions further cause the machine to sync, via the fabrication center connector websocket, the at least one enhanced cut, bend, or threading list to ensure that the at least some of the plurality of workstations have the most current information to work from.

20. The one or more non-transitory computer readable media of claim 14, wherein, when executed by the at least one processor, the program instructions further cause the machine to enable, via the fabrication center connector websocket, utilization of at least a portion of the 3D model of the to-be-fabricated part or assembly by a user of at least one other computing device in the absence of the 3D modeling application being installed or running on the at least one other computing device.

* * * * *